US012732173B2

(12) United States Patent
Ishida et al.

(10) Patent No.: US 12,732,173 B2
(45) Date of Patent: Sep. 8, 2026

(54) PHASE INTERPOLATION CIRCUIT

(71) Applicant: THINE ELECTRONICS, INC., Tokyo (JP)

(72) Inventors: Tomohiro Ishida, Tokyo (JP); Shunichi Kubo, Tokyo (JP)

(73) Assignee: THINE ELECTRONICS, INC., Tokyo (JP)

( * ) Notice: Subject to any disclaimer, the term of this patent is extended or adjusted under 35 U.S.C. 154(b) by 0 days.

(21) Appl. No.: 18/707,336

(22) PCT Filed: Nov. 7, 2022

(86) PCT No.: PCT/JP2022/041413
§ 371 (c)(1),
(2) Date: May 3, 2024

(87) PCT Pub. No.: WO2023/080241
PCT Pub. Date: May 11, 2023

(65) Prior Publication Data

US 2025/0038740 A1 Jan. 30, 2025

(30) Foreign Application Priority Data

Nov. 8, 2021 (JP) ................................ 2021-181676

(51) Int. Cl.
*H03K 5/13* (2014.01)
*H03H 7/06* (2006.01)
(Continued)

(52) U.S. Cl.
CPC ................ *H03K 5/13* (2013.01); *H03H 7/06* (2013.01); *H03H 11/04* (2013.01); *H03K 2005/00052* (2013.01)

(58) Field of Classification Search
CPC .. H03K 5/13; H03K 2005/00052; H03K 5/00; H03H 7/06; H03H 11/04; H03H 11/16
(Continued)

(56) References Cited

U.S. PATENT DOCUMENTS 5,532,636 A * 7/1996 Mar ..................... H03L 7/0896 327/543
5,546,022 A * 8/1996 D'Souza .......... H03K 19/00361 326/87
(Continued)

FOREIGN PATENT DOCUMENTS

CN 109217849 A 1/2019
JP 51-123533 A 10/1976
(Continued)

OTHER PUBLICATIONS

Satoshi Kumaki, et al., "A 0.5V 6-bit Scalable Phase Interpolator", IEEE, 2010, pp. 1019-1022.
(Continued)

*Primary Examiner* — Ryan Jager
(74) *Attorney, Agent, or Firm* — Sughrue Mion, PLLC

(57) ABSTRACT

A current control unit 10 of a phase interpolation circuit 1 includes M slice circuits 60$B_0$ to 60$B_{M-1}$ having a common configuration. Each slice circuit 60$B_m$ includes a selector 61, a PMOS transistor 62, an NMOS transistor 63, a PMOS transistor 64, an NMOS transistor 65, a first standby voltage set circuit 70, and a second standby voltage set circuit 80. The first standby voltage set circuit 70 has a configuration connecting the first node N1 and the voltage source via a switch the on/off of which is set according to the output signal from the selector 61, and sets the first node N1 to a standby voltage by supplementarily charging and discharging the parasitic capacitance of the first node N1 when the switch is in the on state.

10 Claims, 30 Drawing Sheets

(51) Int. Cl.
*H03H 11/04* (2006.01)
*H03K 5/00* (2006.01)

(58) Field of Classification Search
USPC .......................................................... 327/291
See application file for complete search history.

(56) References Cited

U.S. PATENT DOCUMENTS

| | | | | |
|---|---|---|---|---|
| 5,825,640 | A * | 10/1998 | Quigley | H03L 7/0895<br>363/60 |
| 6,420,914 | B1 * | 7/2002 | Hasegawa | H02M 3/07<br>330/262 |
| 6,535,051 | B2 * | 3/2003 | Kim | H03L 7/0895<br>327/535 |
| 7,593,496 | B2 * | 9/2009 | Fan | H03H 11/16<br>331/25 |
| 7,915,933 | B2 * | 3/2011 | Vlasenko | G05F 1/625<br>327/536 |
| 10,171,091 | B2 * | 1/2019 | Song | H04L 7/0087 |
| 10,199,933 | B2 * | 2/2019 | Vlasenko | G05F 3/02 |
| 2002/0089382 | A1 * | 7/2002 | Yang | H03L 7/0895<br>331/25 |
| 2003/0218486 | A1 * | 11/2003 | Kwak | H03L 7/087<br>327/158 |
| 2004/0104747 | A1 * | 6/2004 | Moyal | H03L 7/0895<br>327/112 |
| 2007/0147564 | A1 * | 6/2007 | Fan | H03H 11/16<br>375/362 |
| 2010/0079180 | A1 * | 4/2010 | Kim | H03L 7/0818<br>327/158 |
| 2013/0069701 | A1 * | 3/2013 | Huang | H03K 5/131<br>327/175 |
| 2014/0146932 | A1 * | 5/2014 | Song | H04L 7/0029<br>375/371 |
| 2018/0152190 | A1 * | 5/2018 | Song | H03L 7/0807 |
| 2020/0195240 | A1 * | 6/2020 | Lim | H03L 7/0814 |

FOREIGN PATENT DOCUMENTS

| | | | |
|---|---|---|---|
| JP | 02-35819 | A | 2/1990 |
| JP | 8-223026 | A | 8/1996 |
| JP | 11-274920 | A | 10/1999 |
| JP | 2009-027584 | A | 2/2009 |
| JP | 2010-511368 | A | 4/2010 |
| JP | 2012175683 | A | 9/2012 |
| JP | 2013-9309 | A | 1/2013 |
| WO | 2008/064464 | A1 | 6/2008 |

OTHER PUBLICATIONS

Daniel Junehee Lee, et al., "Architectures and Design Techniques of Digital Time Interpolators", 2018 3rd International Conference on Integrated Circuits and Microsystems, pp. 15-20.
International Search Report (PCT/ISA/210) dated Jan. 24, 2023 issued by the International Searching Authority in International Application No. PCT/JP2022/041413.
International Preliminary Report on Patentability (with translation of Written Opinion) mailed May 16, 2024, issued in International Application No. PCT/JP2022/041413.

* cited by examiner

2
IN1p
IN2p
SEL<0>~SEL<M-1>
BIASp
BIASn
40
BIAS VOLTAGE SUPPLY UNIT
IN1n
IN2n
10p
CURRENT CONTROL UNIT
10n
CURRENT CONTROL UNIT
20p
FILTER
20n
FILTER
30p
WAVEFORM SHAPING UNIT
30n
WAVEFORM SHAPING UNIT
50
51
52
OUTp
OUTn

PHASE INTERPOLATION CIRCUIT

CROSS REFERENCE TO RELATED APPLICATIONS

This application is a National Stage of International Application No. PCT/JP2022/041413 filed Nov. 7, 2022, claiming priority based on Japanese Patent Application No. 2021-181676 filed Nov. 8, 2021.

TECHNICAL FIELD

The present invention relates to a scalable INV-type phase interpolation circuit.

BACKGROUND ART

A phase interpolation circuit can receive a plurality of (in many cases, two) signals having phases different from each other as an input, and output a signal the phase of which is interpolated on the basis of the plurality of input signals. For example, the phase interpolation circuit is used as a circuit that generates a clock indicating timing of data sampling in a clock data recovery circuit, and the timing of data sampling can be adjusted by adjusting the phase of the clock. In addition, the phase interpolation circuit is also used in an interleaved-type analog-digital conversion circuit, an EYE monitor circuit, or the like.

The phase interpolation circuit is roughly divided into a current mode logic (CML) type and an inverter (INV) type (see Non Patent Literature 1). Compared with the CML-type phase interpolation circuit, the INV-type phase interpolation circuit is inferior in linearity of phase interpolation, but is suitable for use in a low-voltage source, and has advantages of low power consumption and small size. Any type of phase interpolation circuit is preferably used according to a system including the phase interpolation circuit.

For example, in order to achieve low power consumption in a receiver circuit operating with a clock having a frequency of about 30 GHz, a manufacturing process node finer than about 20 nm is required. The finer the manufacturing process is, the lower the power supply voltage during circuit operation is. In the CML-type phase interpolation circuit, an insufficient voltage headroom due to a low voltage source tends to be a problem, and as a result, phase accuracy deteriorates. Therefore, in the case of high-speed operation, it is preferable to use the INV-type phase interpolation circuit.

There are several configurations of the INV-type phase interpolation circuit, and a configuration for improving linearity of phase interpolation has been proposed (see Non Patent Literature 2). Among the INV-type phase interpolation circuits, one widely used at present is a scalable INV-type phase interpolation circuit that controls the magnitude of the current flowing through the inverter with a current source.

CITATION LIST

Non Patent Literature

Non Patent Literature 1: Satoshi Kumaki, et al., "A O.5V 6-bit Scalable Phase Interpolator", IEEE, pp. 1019-1022, (2010).

Non Patent Literature 2: Daniel Junehee Lee, et al., "Architectures and Design Techniques of Digital Time Interpolators", 2018 3rd International Conference on Integrated Circuits and Microsystems, pp. 15-20 (2018).

SUMMARY OF INVENTION

Technical Problem

The scalable INV-type phase interpolation circuit has excellent linearity of phase interpolation among the INV-type phase interpolation circuits, but further improvement in the linearity is desired. In particular, as the speed of the signal increases, improvement in the linearity of the phase interpolation in the phase interpolation circuit is strongly desired.

The present invention has been made to solve the above problems, and an object thereof is to provide a scalable INV-type phase interpolation circuit with improved linearity of phase interpolation.

Solution to Problem

A phase interpolation circuit of the present disclosure is a scalable INV-type phase interpolation circuit that includes a current control unit including a plurality of slice circuits that outputs, from an output terminal, a current signal corresponding to any signal selected from a plurality of input signals having phases different from each other, and outputs a signal the phase of which is interpolated on the basis of the plurality of input signals.

In a first aspect of the present disclosure, each of a plurality of slice circuits includes: (1) a selector configured to select and output any signal of a plurality of input signals on the basis of a selection signal; (2) a PMOS transistor having a gate to which the signal output from the selector is input, a source connected to a high potential supply terminal, and a drain; (3) an NMOS transistor having a gate to which the signal output from the selector is input, a source connected to a low potential supply terminal, and a drain; (4) a first current source provided between the drain of the PMOS transistor and the output terminal; (5) a second current source provided between the drain of the NMOS transistor and the output terminal; (6) a first standby voltage set circuit configured to set a first node between the drain of the PMOS transistor and the first current source to a standby voltage by charging and discharging a parasitic capacitance at the first node; and (7) a second standby voltage set circuit configured to set a second node between the drain of the NMOS transistor and the second current source to a standby voltage by charging and discharging a parasitic capacitance at the second node.

In a second aspect of the present disclosure, each of a plurality of slice circuits includes: (1) a selector configured to select and output any signal of a plurality of input signals on the basis of a selection signal; (2) a PMOS transistor having a gate to which the signal output from the selector is input, a drain connected to an output terminal, and a source; (3) an NMOS transistor having a gate to which the signal output from the selector is input, a drain connected to an output terminal, and a source; (4) a first current source provided between the source of the PMOS transistor and a high potential supply terminal; (5) a second current source provided between the source of the NMOS transistor and a low potential supply terminal; (6) a first standby voltage set circuit configured to set a first node between the source of the PMOS transistor and the first current source to a standby voltage by charging and discharging a parasitic capacitance at the first node; and (7) a second standby voltage set circuit configured to set a second node between the source of the NMOS transistor and the second current source to a standby voltage by charging and discharging a parasitic capacitance at the second node.

In the first aspect or the second aspect of the present disclosure, the first standby voltage set circuit includes an NMOS transistor provided between a low potential supply terminal and the first node, and the signal output from the selector is preferably input to a gate of the NMOS transistor. The second standby voltage set circuit includes a PMOS transistor provided between a high potential supply terminal and the second node, and the signal output from the selector is preferably input to a gate of the PMOS transistor.

Alternatively, in the first aspect or the second aspect of the present disclosure, the first standby voltage set circuit includes a first resistor and a second resistor provided in series between a high potential supply terminal and a low potential supply terminal, a first NMOS transistor provided between a connection point between the first resistor and the second resistor and the first node, and a second NMOS transistor provided in series with respect to the first resistor and the second resistor, and the signal output from the selector is preferably input to the gates of the first NMOS transistor and the second NMOS transistor. The second standby voltage set circuit includes a third resistor and a fourth resistor provided in series between a high potential supply terminal and a low potential supply terminal, a first PMOS transistor provided between a connection point between the third resistor and the fourth resistor and the second node, and a second PMOS transistor provided in series with respect to the third resistor and the fourth resistor, and a signal output from the selector is preferably input to the gates of the first PMOS transistor and the second PMOS transistor.

Alternatively, in the first aspect or the second aspect of the present disclosure, the first standby voltage set circuit includes a first voltage follower amplifier configured to receive the potential of the output terminal of the slice circuit and an NMOS transistor provided between the output terminal of the first voltage follower amplifier and the first node, and the signal output from the selector is preferably input to the gate of the NMOS transistor. The second standby voltage set circuit includes a second voltage follower amplifier configured to receive the potential of the output terminal of the slice circuit and a PMOS transistor provided between the output terminal of the second voltage follower amplifier and the second node, and the signal output from the selector is preferably input to the gate of the PMOS transistor.

In this case, each of the slice circuits may include a common voltage follower amplifier as the first voltage follower amplifier and the second voltage follower amplifier. Alternatively, the current control unit may include a first common voltage follower amplifier as the first voltage follower amplifier of each of the slice circuits, and may include a second common voltage follower amplifier as the second voltage follower amplifier of each of the slice circuits. Alternatively, the current control unit may include a common voltage follower amplifier as the first voltage follower amplifier and the second voltage follower amplifier of each of the slice circuits.

In a third aspect of the present disclosure, each of a plurality of slice circuits includes: (1) a selector configured to select and output any signal of a plurality of input signals on the basis of a selection signal; (2) a PMOS transistor having a gate to which the signal output from the selector is input, a source connected to a high potential supply terminal, and a drain; (3) an NMOS transistor having a gate to which the signal output from the selector is input, a source connected to a low potential supply terminal, and a drain; (4) a first current source provided between the drain of the PMOS transistor and the output terminal; and (5) a second current source provided between the drain of the NMOS transistor and the output terminal, the drain of the PMOS transistor and the drain of the NMOS transistor being connected to each other.

In the first to third aspects of the present disclosure, the phase interpolation circuit may further include: (a) a filter configured to include a capacitance unit charged and discharged according to a sum of current signals output from the plurality of slice circuits of the current control unit and output a voltage signal according to an accumulated charge amount in the capacitance unit; and (b) a waveform shaping unit configured to shape a waveform of the voltage signal output from the filter and output the waveform-shaped signal.

Advantageous Effects of Invention

According to the present disclosure, it is possible to provide a scalable INV-type phase interpolation circuit with improved linearity of phase interpolation.

DESCRIPTION OF EMBODIMENTS

Figure 1:
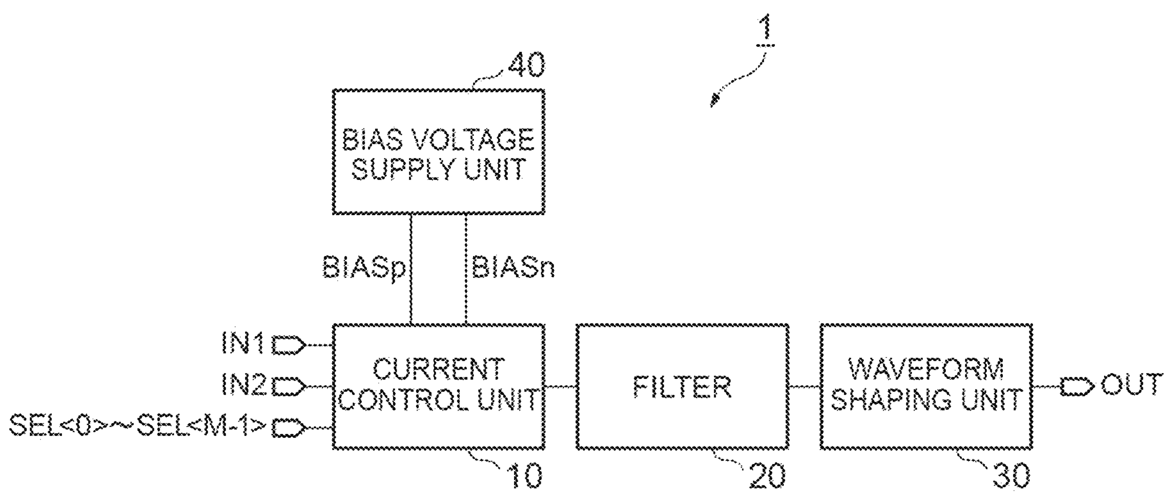
FIG. 1 is a diagram illustrating a configuration of a phase interpolation circuit 1.

Hereinafter, embodiments of the present invention will be described in detail with reference to the accompanying drawings. In the description of the drawings, the same elements are denoted by the same reference numerals, and redundant description will be omitted. The present invention is not limited to these examples, but is indicated by the claims, and is intended to include all modifications within the meaning and scope equivalent to the claims.

Figure 2:
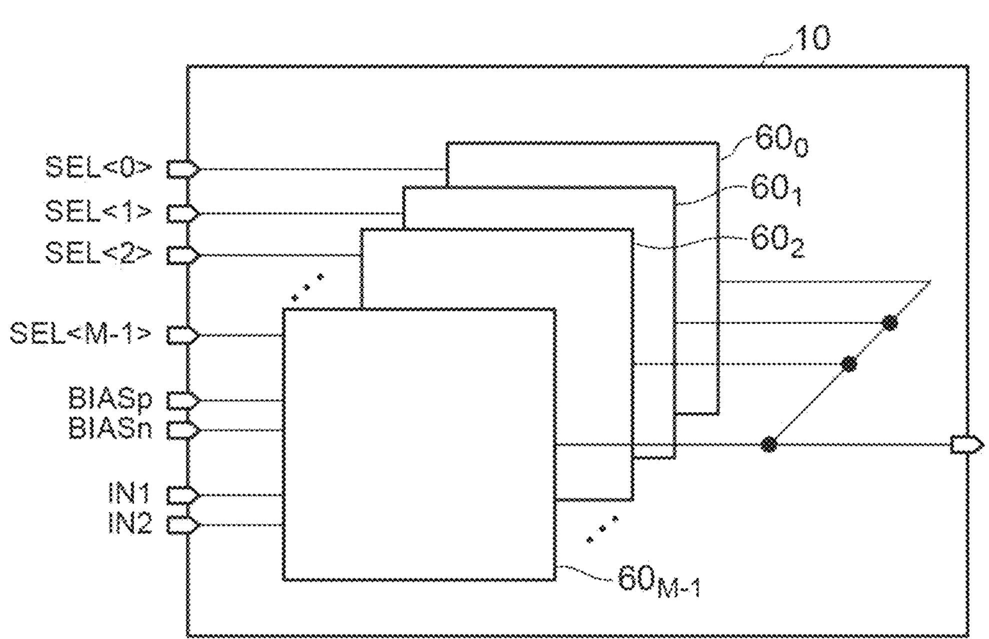
FIG. 2 is a diagram illustrating a configuration of a current control unit 10 of the phase interpolation circuit 1.

FIG. 1 is a diagram illustrating a configuration of a phase interpolation circuit 1. The phase interpolation circuit 1 includes a current control unit 10, a filter 20, a waveform shaping unit 30, and a bias voltage supply unit 40. FIG. 2 is a diagram illustrating a configuration of the current control unit 10 of the phase interpolation circuit 1.

The current control unit 10 includes a plurality of (M) slice circuits $60_0$ to $60_{M-1}$. Each of the M slice circuits $60_0$ to $60_{M-1}$ has a common configuration, and receives a plurality of input signals having phases different form each other in common as an input, and also receives bias voltages BIASp and BIASn in common as an input. In many cases, the number of input signals to be input to each slice circuit $60_m$ is two, the input signals having phases different form each other. In the following description, it is assumed that two input signals IN1 and IN2 are input to each slice circuit $60_m$. M is an integer of two or more, and m is an integer of zero or more and less than M.

The m-th slice circuit $60_m$ of the M slice circuits $60_0$ to $60_{M-1}$ receives a selection signal SEL<m>. The slice circuit $60_m$ selects one signal of the input signals IN1 and IN2 on the basis of the selection signal SEL<m>, and outputs a current signal corresponding to the selected signal from the output terminal. The output terminals of the M slice circuits $60_0$ to $60_{M-1}$ are common, and the current control unit 10 outputs the sum of the current signals output from the M slice circuits $60_0$ to $60_{M-1}$.

The filter 20 includes a capacitance unit that is charged and discharged in accordance with the current signal output from the current control unit 10, and outputs a voltage signal corresponding to an accumulated charge amount in the capacitance unit. One end of the capacitance unit of the filter 20 is connected to the output terminal of the current control unit 10, and the other end of the capacitance unit is connected to a ground potential supply terminal. The waveform shaping unit 30 shapes the waveform of the voltage signal output from the filter 20 and outputs the signal after the waveform shaping from an output terminal OUT. The bias voltage supply unit 40 supplies the bias voltages BIASp and BIASn to the M slice circuits $60_0$ to $60_{M-1}$.

Figure 3:
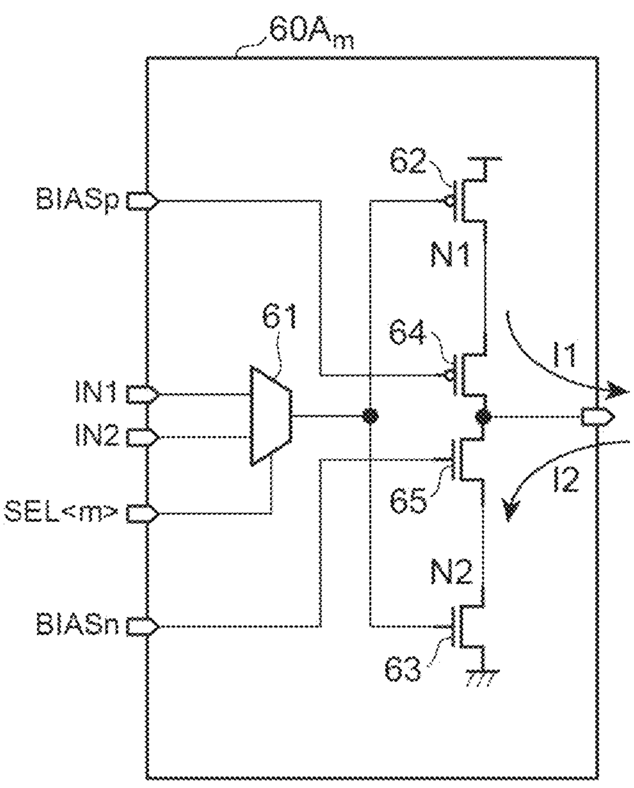
FIG. 3 is a diagram illustrating a configuration of a slice circuit 60$A_m$ of the current control unit 10.

Hereinafter, a circuit configuration example of the slice circuit $60_m$ of the current control unit 10 will be described. FIG. 3 is a diagram illustrating a configuration of a slice circuit $60A_m$ of the current control unit 10. The slice circuit $60A_m$ illustrated in this drawing includes a selector 61, a PMOS transistor 62, an NMOS transistor 63, a PMOS transistor 64, and an NMOS transistor 65. Note that the PMOS transistor means a P-channel metal oxide semiconductor transistor, the NMOS transistor means an N-channel metal oxide semiconductor transistor, and these transistors are field effect transistors.

The selector 61 receives two input signals IN1 and IN2 having phases different form each other and receives the selection signal SEL<m>. The selector 61 selects one signal of the input signals IN1 and IN2 on the basis of the selection signal SEL<m>, and gives the selected signal to the gates of the PMOS transistor 62 and the NMOS transistor 63.

The source of the PMOS transistor 62 is connected to a high potential (power supply potential) supply terminal. The signal output from the selector 61 is input to the gate of the PMOS transistor 62. The drain of the PMOS transistor 62 is connected to the source of the PMOS transistor 64.

The source of the NMOS transistor 63 is connected to a low potential (ground potential) supply terminal. The signal output from the selector 61 is input to the gate of the NMOS transistor 63. The drain of the NMOS transistor 63 is connected to the source of the NMOS transistor 65.

Each of the PMOS transistor 62 and the NMOS transistor 63 is a switch the on/off of which is set according to the signal output from the selector 61 and input to the gate. When the signal output from the selector 61 is at the H level, the PMOS transistor 62 is in the off state, and the NMOS transistor 63 is in the on state. Conversely, when the signal output from the selector 61 is at the L level, the PMOS transistor 62 is in the on state, and the NMOS transistor 63 is in the off state.

Each drain of the PMOS transistor 64 and the NMOS transistor 65 is connected to the output terminal of the slice circuit $60A_m$. The bias voltage BIASp is input to the gate of the PMOS transistor 64. The PMOS transistor 64 is a first current source provided between the drain of the PMOS transistor 62 and the output terminal. The bias voltage BIASn is input to the gate of the NMOS transistor 65. The NMOS transistor 65 is a second current source provided between the drain of the NMOS transistor 63 and the output terminal.

When the PMOS transistor 62 is in the on state and the NMOS transistor 63 is in the off state, a current I1 by the PMOS transistor 64 as the first current source flows from the power supply potential supply terminal to the output terminal via the PMOS transistors 62 and 64. Conversely, when the PMOS transistor 62 is in the off state and the NMOS transistor 63 is in the on state, a current I2 by the NMOS transistor 65 as the second current source flows from the output terminal to the ground potential supply terminal via the NMOS transistors 65 and 63.

Which of the current I1 (current from the power supply potential supply terminal to the output terminal) and the current I2 (current from the output terminal to the ground potential supply terminal) the current signal output from each slice circuit $60A_m$ is corresponds to the level of the output signal from the selector 61. The timing of switching between the current I1 and the current I2 is the timing of level transition of the output signal from the selector 61. That is, the current signal (I1, I2) output from each slice circuit $60A_m$ is determined by the selection signal SEL<m>.

The current signal output from the current control unit 10 to the filter 20 is the sum of the current signals output from each of the M slice circuits $60A_0$ to $60A_{M-1}$. The phase of the current signal output from the current control unit 10 is determined by a ratio between the number of slice circuits in which the selector 61 selects the input signal IN1 and the number of slice circuits in which the selector 61 selects the input signal IN2. That is, the phase of the current signal output from the current control unit 10 corresponds to the selection signal SEL<m> input to each slice circuit $60A_m$. Then, the phase of the output signal from the phase interpolation circuit 1 corresponds to the voltage signal obtained by the current signal output from the current control unit 10 through the filter 20.

In the current control unit 10 of the phase interpolation circuit 1 as described above, a parasitic capacitance exists at a first node N1 between the drain of the PMOS transistor 62 and the source of the PMOS transistor 64. In addition, a parasitic capacitance also exists at a second node N2 between the drain of the NMOS transistor 63 and the source of the NMOS transistor 65. The parasitic capacitances of the nodes N1 and N2 are charged and discharged by charge current flowing in or flowing out at the time of switching between the current I1 and the current I2.

The period during which the unintended parasitic capacitance charge current is flowing is a transient period between the current I1 and the current I2, and is in an intermediate state that is a current state different from both the current I1 and the current I2. This intermediate state continues until the parasitic capacitance is sufficiently charged and discharged and no parasitic capacitance charge current flows.

Then, when this intermediate state occurs, the phase of the output signal from the phase interpolation circuit 1 is different from the intended phase to be set by the selection signals SEL<0> to SEL<M-1>, whereby the linearity of the phase interpolation is deteriorated. The higher the speed of the signal is, the more the linearity of the phase interpolation caused by the parasitic capacitance charge current is deteriorated. The deterioration of the linearity of the phase interpolation may cause a large problem in some systems. Note that the linearity of the phase interpolation is linearity between the PI code corresponding to the selection signals SEL<0> to SEL<M-1> and the output phase, and is an index indicating the accuracy of the phase interpolation.

Figure 4:
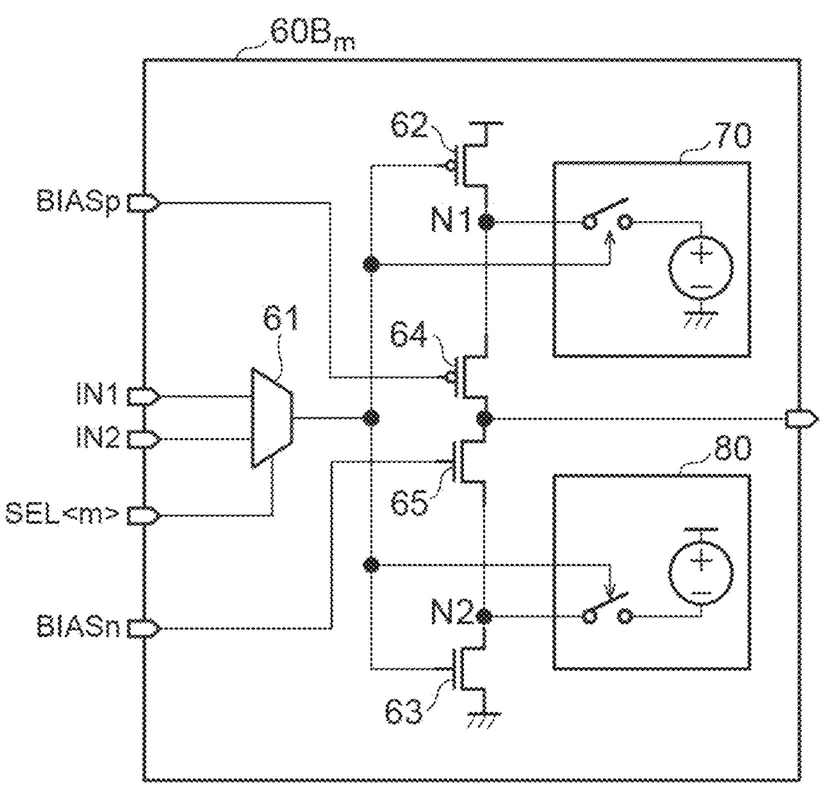
FIG. 4 is a diagram illustrating a configuration of a slice circuit 60$B_m$ of the current control unit 10.

FIG. 4 is a diagram illustrating a configuration of a slice circuit $60B_m$ of the current control unit 10. The slice circuit $60B_m$ illustrated in this drawing further includes a first standby voltage set circuit 70 and a second standby voltage set circuit 80 in addition to the configuration of the slice circuit $60A_m$ illustrated in FIG. 3. The slice circuit $60B_m$ solves the problem caused by the charge current of the parasitic capacitance of the nodes N1 and N2 described above, and improves the linearity of the phase interpolation.

The first standby voltage set circuit 70 has a configuration connecting the first node N1 and the voltage source via a switch the on/off of which is set according to the output signal from the selector 61, and sets the first node N1 to a standby voltage by supplementarily charging and discharging the parasitic capacitance of the first node N1 when the switch is in the on state.

The second standby voltage set circuit 80 has a configuration connecting the second node N2 and the voltage source via a switch the on/off of which is set according to the output signal from the selector 61, and sets the second node N2 to a standby voltage by supplementarily charging and discharging the parasitic capacitance of the second node N2 when the switch is in the on state.

In the phase interpolation circuit 1 including such a slice circuit $60B_m$, the first node N1 is set to the standby voltage by the first standby voltage set circuit 70 charging and discharging the parasitic capacitance of the first node N1, and the second node N2 is set to the standby voltage by the second standby voltage set circuit 80 charging and discharging the parasitic capacitance of the second node N2, so that the linearity between the PI code and the output phase can be improved.

FIGS. 5 to 8 are diagrams illustrating specific circuit configurations of the first standby voltage set circuit 70 and the second standby voltage set circuit 80 in the configuration of the slice circuit $60B_m$ illustrated in FIG. 4.

Figure 5:
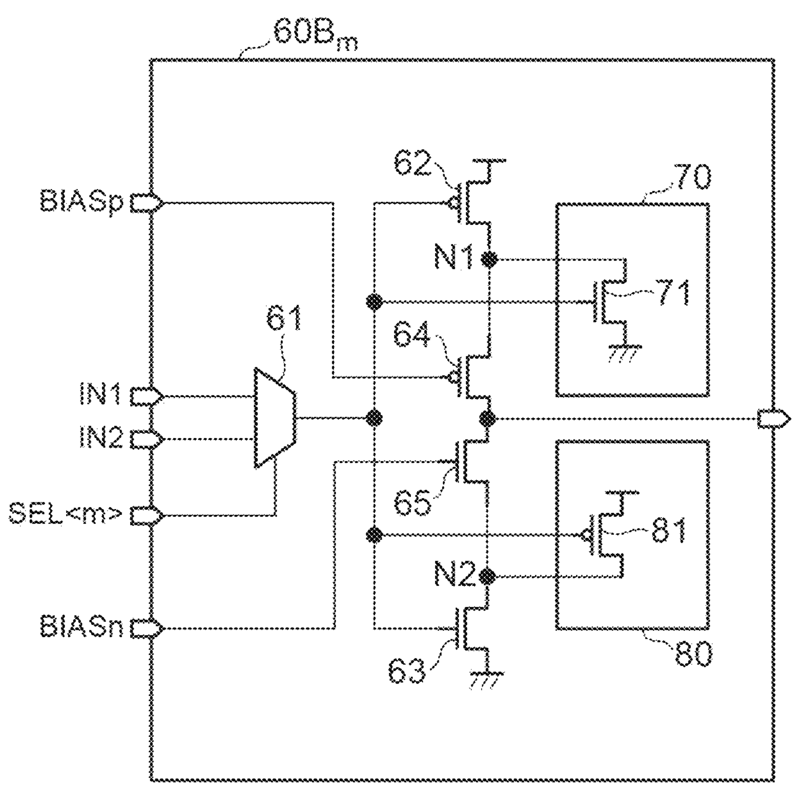
FIG. 5 is a diagram illustrating a circuit configuration example of the slice circuit 60$B_m$ of the current control unit 10.

In the slice circuit $60B_m$ of the circuit configuration example illustrated in FIG. 5, the first standby voltage set circuit 70 includes an NMOS transistor 71, and the second standby voltage set circuit 80 includes a PMOS transistor 81. The respective standby voltages are approximately a ground potential and a power supply potential. Each of the NMOS transistor 71 and the PMOS transistor 81 is a switch the on/off of which is set according to the output signal from the selector 61.

The NMOS transistor 71 is provided between the ground potential supply terminal and the first node N1, and the output signal from the selector 61 is input to the gate. When being set in the on state, the NMOS transistor 71 reduces the charge current flowing from the PMOS transistor 64 to the parasitic capacitance of the first node N1 by setting the first node N1 to a predetermined standby voltage.

The PMOS transistor 81 is provided between the power supply potential supply terminal and the second node N2, and the output signal from the selector 61 is input to the gate. When being in the on state, the PMOS transistor 81 reduces the charge current flowing from the NMOS transistor 65 to the parasitic capacitance of the second node N2 by setting the second node N2 to a predetermined standby voltage.

The NMOS transistor 71 and the PMOS transistor 81 have a role of only setting the nodes N1 and N2 to a predetermined standby voltage, and thus the size may be smaller than other MOS transistors. In that case, it is possible to reduce the demerit of an increase in the layout area when the circuits are formed on the semiconductor substrate.

Figure 6:
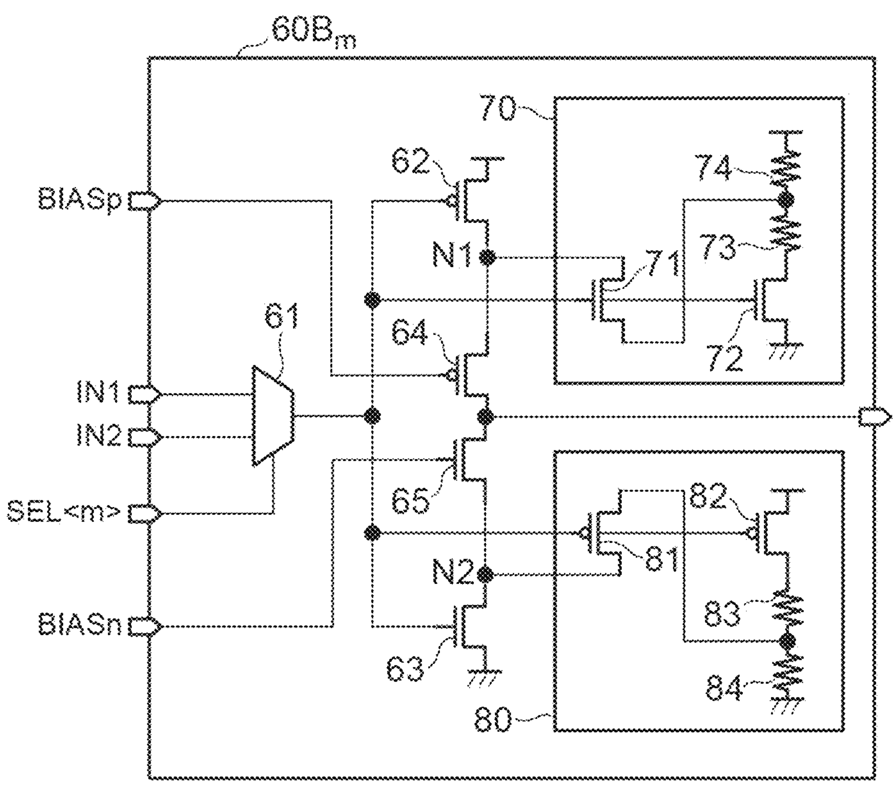
FIG. 6 is a diagram illustrating a circuit configuration example of the slice circuit 60$B_m$ of the current control unit 10.

In the slice circuit 60$B_m$ of the circuit configuration example illustrated in FIG. 6, the first standby voltage set circuit 70 includes NMOS transistors 71 and 72 (a first NMOS transistor 71, a second NMOS transistor 72) and resistors 73 and 74 (a first resistor 73, a second resistor 74), and the second standby voltage set circuit 80 includes PMOS transistors 81 and 82 (a first PMOS transistor 81, a second PMOS transistor 82) and resistors 83 and 84 (a third resistor 83, a fourth resistor 84). The NMOS transistors 71 and 72 and the PMOS transistors 81 and 82 are switches the on/off of which is set according to the output signal from the selector 61.

In the first standby voltage set circuit 70, the NMOS transistor 72 and the resistors 73 and 74 are provided in series between the power supply potential supply terminal and the ground potential supply terminal. The NMOS transistor 71 is provided between the connection point of the resistors 73 and 74 and the first node N1. The output signal from the selector 61 is input to each gate of the NMOS transistors 71 and 72. When the NMOS transistors 71 and 72 are in the on state, a voltage value corresponding to the ratio of the resistance values of the resistors 73 and 74 is provided to the first node N1, so that the first node N1 is set to a predetermined standby voltage. When the NMOS transistors 71 and 72 are in the off state, no current flows through the resistors 73 and 74 connected in series.

In the second standby voltage set circuit 80, the PMOS transistor 82 and the resistors 83 and 84 are provided in series between the power supply potential supply terminal and the ground potential supply terminal. The PMOS transistor 81 is provided between the connection point of the resistors 83 and 84 and the second node N2. The output signal from the selector 61 is input to each gate of the PMOS transistors 81 and 82. When the PMOS transistors 81 and 82 are in the on state, a voltage value corresponding to the ratio of the resistance values of the resistors 83 and 84 is provided to the second node N2, so that the second node N2 is set to a predetermined standby voltage. When the PMOS transistors 81 and 82 are in the off state, no current flows through the resistors 83 and 84 connected in series.

In the slice circuit 60$B_m$, since the standby voltage set at the nodes N1 and N2 can be prevented from reaching the power supply potential or the ground potential, it is possible to shorten the time required for the output current of the slice circuit 60$B_m$ to be stabilized when the level of the output signal from the selector 61 transitions. The resistance value ratio between the resistor 73 and the resistor 74 and the resistance value ratio between the resistor 83 and the resistor 84 are desirably set so that the potentials of the nodes N1 and N2 are the same degree as the potential of the output terminal of the slice circuit 60$B_m$ when the level of the output signal from the selector 61 transitions.

Figure 7:
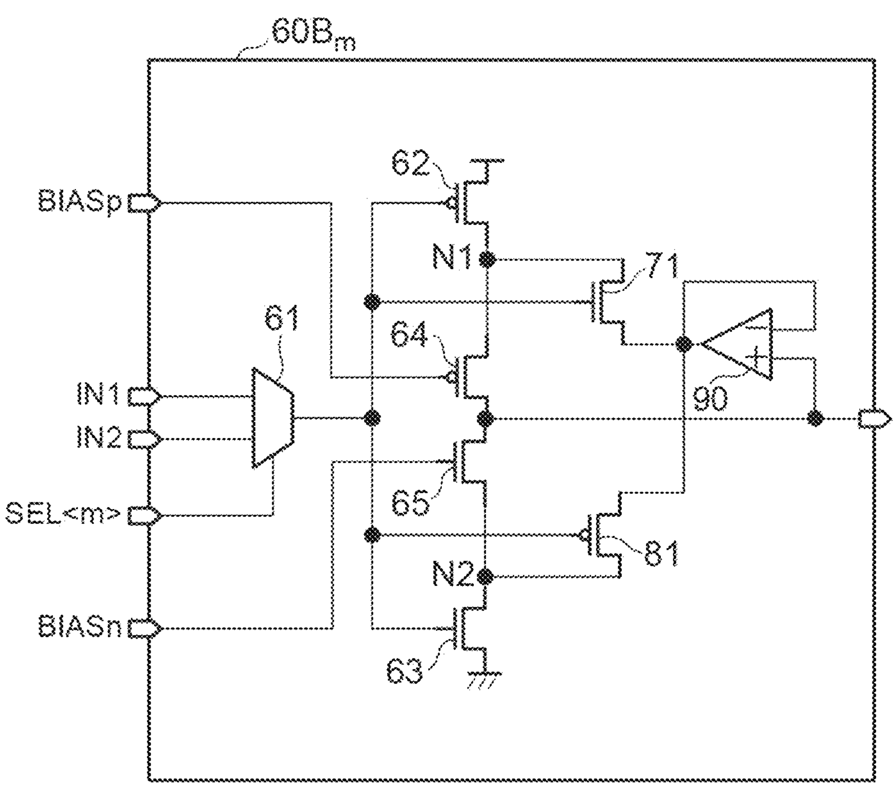
FIG. 7 is a diagram illustrating a circuit configuration example of the slice circuit 60$B_m$ of the current control unit 10.

In the slice circuit 60$B_m$ of the circuit configuration example illustrated in FIG. 7, the first standby voltage set circuit 70 includes the NMOS transistor 71 an amplifier 90, and the second standby voltage set circuit 80 includes the PMOS transistor 81 and the amplifier 90. Although the first standby voltage set circuit 70 and the second standby voltage set circuit 80 share one amplifier 90 in this drawing, an amplifier may be individually included. The NMOS transistor 71 and the PMOS transistor 81 are switches the on/off of which is set according to the output signal from the selector 61.

The non-inverting input terminal of the amplifier 90 is connected to the output terminal of the slice circuit 60$B_m$. The inverting input terminal and the output terminal of the amplifier 90 are connected to each other. The amplifier 90 is a voltage follower amplifier. The NMOS transistor 71 is provided between the output terminal of the amplifier 90 and the first node N1. The output signal from the selector 61 is input to the gate of the NMOS transistor 71. The PMOS transistor 81 is provided between the output terminal of the amplifier 90 and the second node N2. The output signal from the selector 61 is input to the gate of the PMOS transistor 81.

In the slice circuit 60$B_m$, since the standby voltage set at the nodes N1 and N2 can be made the same as the potential of the output terminal of the slice circuit 60$B_m$, it is possible to shorten the time required for the output current of the slice circuit 60$B_m$ to be stabilized.

Figure 8:
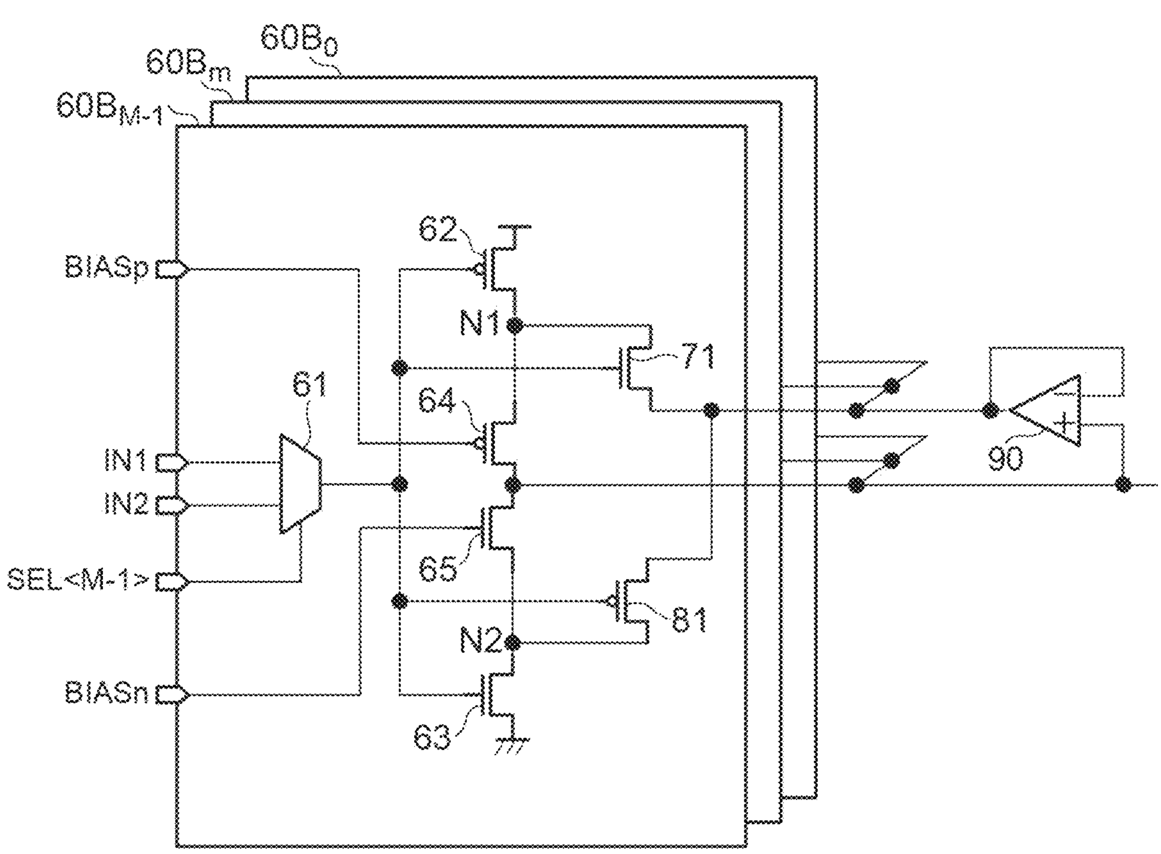
FIG. 8 is a diagram illustrating a circuit configuration example of the slice circuit 60$B_m$ of the current control unit 10.

In the circuit configuration example illustrated in FIG. 8, M slice circuits 60$B_0$ to 60$B_{M-1}$ share one amplifier 90 with respect to the circuit configuration example illustrated in FIG. 7. With such a configuration, it is possible to reduce the demerit of an increase in the layout area when the circuits are formed on the semiconductor substrate.

Note that the amplifier 90 as the voltage follower amplifier is provided in the following several modes.

Each of the M slice circuits 60$B_0$ to 60$B_{M-1}$ may be configured to separately include the voltage follower amplifier of the first standby voltage set circuit 70 and the voltage follower amplifier of the second standby voltage set circuit 80. In this case, the required number of amplifiers is 2M.

Specifically, the voltage follower amplifier 90 illustrated in FIG. 7 is a common voltage follower amplifier in the first and second standby voltage set circuits.

Figure 29:
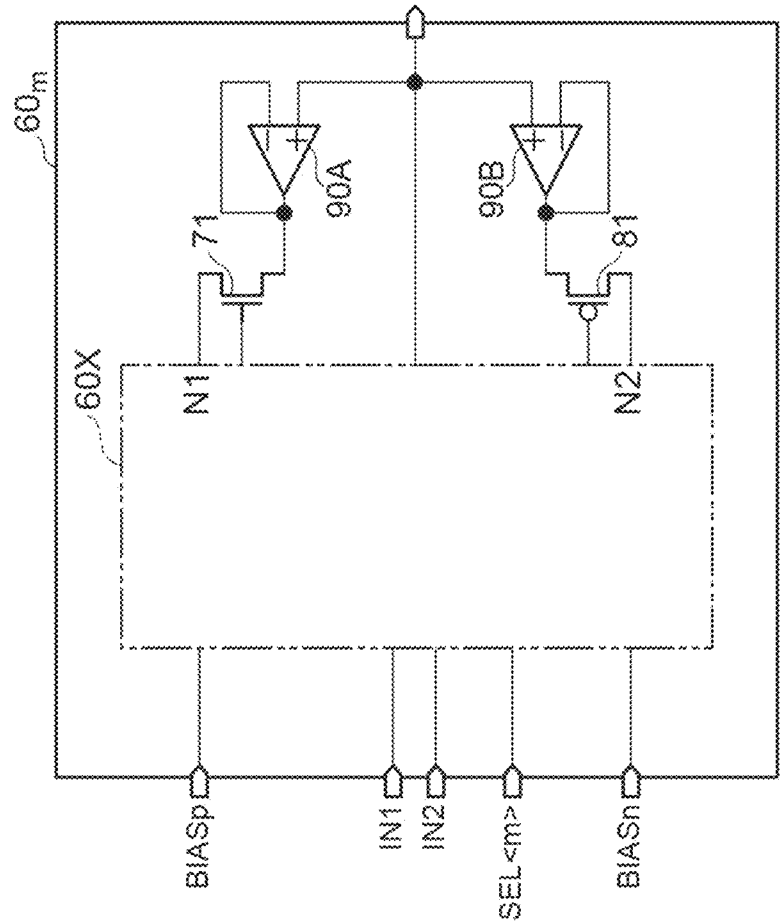
FIG. 29 is a diagram illustrating a circuit configuration example of a slice circuit $60_m$ of the current control unit 10.

FIG. 29 is a diagram illustrating a circuit configuration example of the slice circuit 60$_m$ of the current control unit 10. This drawing illustrates a configuration in which one common voltage follower amplifier is separated into two in one slice circuit 60$_m$. The circuit elements other than the voltage follower amplifier 90, the NMOS transistor 71, and the PMOS transistor 81 in FIGS. 7, 8, 13, and 14 are indicated by a circuit block 60X. That is, the common voltage follower amplifier 90 includes a first voltage follower amplifier 90A for the first standby voltage set circuit and a second voltage follower amplifier 90B for the second standby voltage set circuit.

In this case, the first standby voltage set circuit includes the first voltage follower amplifier 90A to which the potential of the output terminal of the slice circuit is input, and the NMOS transistor 71 provided between the output terminal of the first voltage follower amplifier 90A and the first node N1 and having a gate to which the signal output from the selector 61 is input. The second standby voltage set circuit includes the second voltage follower amplifier 90B to which the potential of the output terminal of the slice circuit is input, and the PMOS transistor 81 provided between the output terminal of the second voltage follower amplifier 90B and the second node N2 and having a gate to which the signal output from the selector 61 is input.

As illustrated in FIG. 7, each of the M slice circuits 60$B_0$ to 60$B_{M-1}$ may include a common voltage follower amplifier as the voltage follower amplifier of the first standby voltage set circuit 70 and the voltage follower amplifier of the second standby voltage set circuit 80. In this case, the required number of amplifiers is M.

Figure 30:
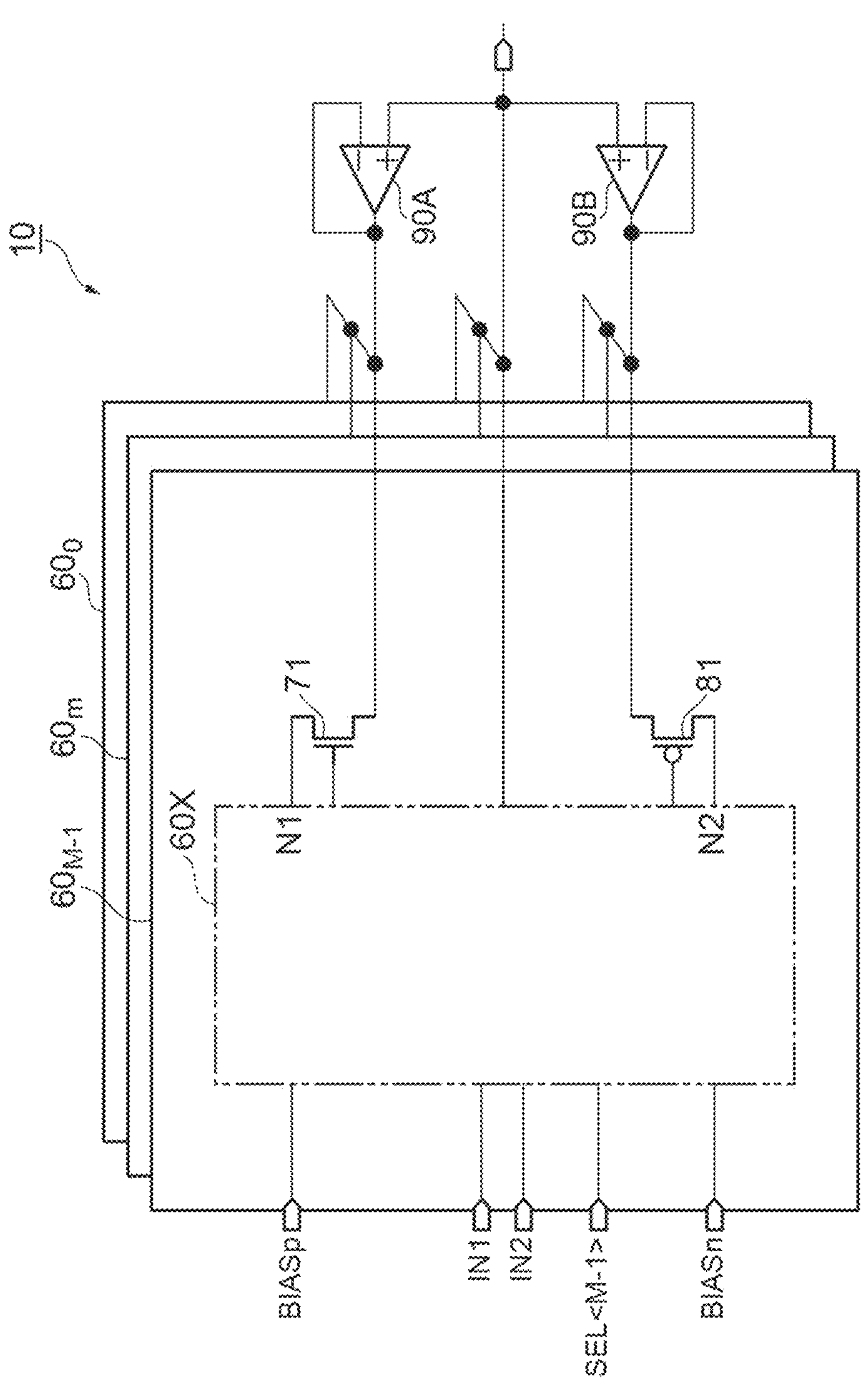
FIG. 30 is a diagram illustrating a configuration of the current control unit 10 including a plurality of slice circuits.

FIG. 30 is a diagram illustrating a configuration of the current control unit 10 including M slice circuits 60$_0$ to 60$_{M-1}$. This drawing illustrates a current control unit including the first common voltage follower amplifier 90A and the second common voltage follower amplifier 90B. The circuit block 60X is the same as that illustrated in FIG. 29. As compared with the current control unit using the configuration in FIG. 29, the current control unit 10 in the present example is different in that a plurality of the first voltage follower amplifiers 90A included in the M slice circuits $\mathbf{60}_0$ to $\mathbf{60}_{M-1}$ are common and a plurality of the second voltage follower amplifiers 90B are common in the present example.

The current control unit 10 can include the first common voltage follower amplifier as the voltage follower amplifier of the first standby voltage set circuit 70 of each of the M slice circuits $\mathbf{60}B_0$ to $\mathbf{60}B_{M-1}$ illustrated in FIG. 8, and include the second common voltage follower amplifier as the voltage follower amplifier of the second standby voltage set circuit 80 of each of the M slice circuits $\mathbf{60}B_0$ to $\mathbf{60}B_{M-1}$. In this case, the required number of amplifiers is two. As illustrated in FIG. 30, the current control unit 10 includes the first common voltage follower amplifier 90A as the voltage follower amplifier of the first standby voltage set circuit 70 of each of the M slice circuits $\mathbf{60}_0$ to $\mathbf{60}_{M-1}$, and includes the second common voltage follower amplifier 90B as the voltage follower amplifier of the second standby voltage set circuit 80 of each of the M slice circuits $\mathbf{60}_0$ to $\mathbf{60}_{M-1}$.

As illustrated in FIG. 8, the current control unit 10 may include a common voltage follower amplifier as the voltage follower amplifier of the first standby voltage set circuit 70 and the voltage follower amplifier of the second standby voltage set circuit 80 of each of the M slice circuits $\mathbf{60}B_0$ to $\mathbf{60}B_{M-1}$. In this case, the required number of amplifiers is one.

Figure 9:
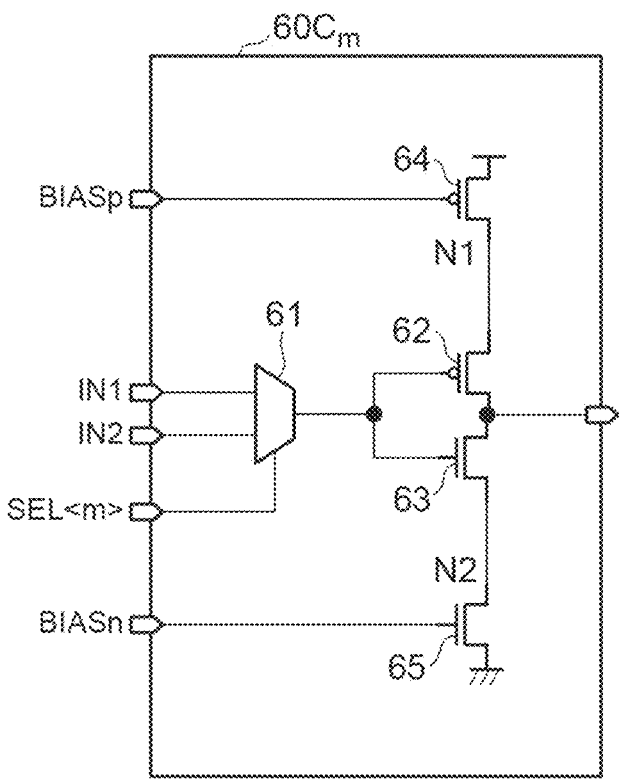
FIG. 9 is a diagram illustrating a configuration of a slice circuit 60$C_m$ of the current control unit 10.

FIG. 9 is a diagram illustrating a configuration of a slice circuit $\mathbf{60}C_m$ of the current control unit 10. In the slice circuit $\mathbf{60}C_m$ illustrated in this drawing, as compared with the configuration of the slice circuit $\mathbf{60}A_m$ illustrated in FIG. 3, the positions of the PMOS transistor 62 and the PMOS transistor 64 are switched, and the positions of the NMOS transistor 63 and the NMOS transistor 65 are switched. The slice circuit $\mathbf{60}C_m$ (FIG. 9) operates similarly to the slice circuit $\mathbf{60}A_m$ (FIG. 3), and has the same problem as the slice circuit $\mathbf{60}A_m$ (FIG. 3) with the parasitic capacitance at the first node N1 between the PMOS transistors 62 and 64 and the parasitic capacitance at the second node N2 between the NMOS transistors 63 and 65.

Figure 10:
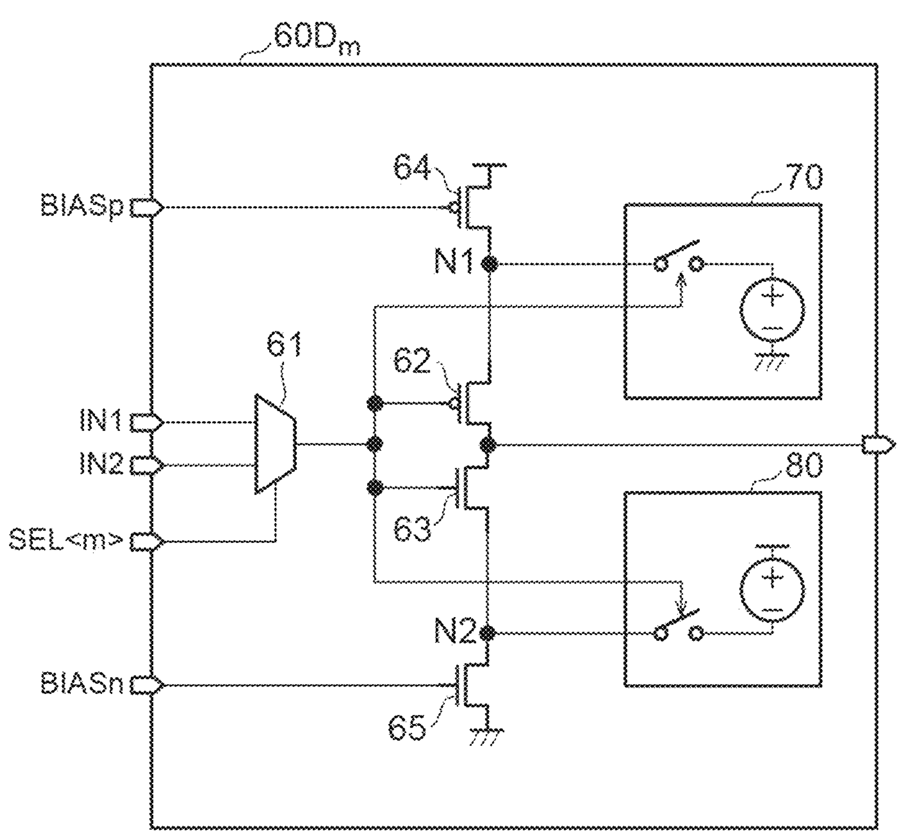
FIG. 10 is a diagram illustrating a configuration of a slice circuit 60$D_m$ of the current control unit 10.

FIG. 10 is a diagram illustrating a configuration of a slice circuit $\mathbf{60}D_m$ of the current control unit 10. The slice circuit $\mathbf{60}D_m$ illustrated in this drawing further includes the first standby voltage set circuit 70 and the second standby voltage set circuit 80 in addition to the configuration of the slice circuit $\mathbf{60}C_m$ illustrated in FIG. 9. The slice circuit $\mathbf{60}D_m$ solves the problem caused by the charge current of the parasitic capacitance of the nodes N1 and N2 described above, and improves the linearity of the phase interpolation. The first standby voltage set circuit 70 and the second standby voltage set circuit 80 of the slice circuit $\mathbf{60}D_m$ (FIG. 10) are similar to the first standby voltage set circuit 70 and the second standby voltage set circuit 80 of the slice circuit $\mathbf{60}B_m$ (FIG. 4).

In the phase interpolation circuit 1 including such a slice circuit $\mathbf{60}D_m$, the first node N1 is set to the standby voltage by charging and discharging the parasitic capacitance of the first node N1 by the first standby voltage set circuit 70, and the second node N2 is set to the standby voltage by charging and discharging the parasitic capacitance of the second node N2 by the second standby voltage set circuit 80, so that the linearity between the PI code and the output phase can be improved.

FIGS. 11 to 14 are diagrams illustrating specific circuit configurations of the first standby voltage set circuit 70 and the second standby voltage set circuit 80 in the configuration of the slice circuit $\mathbf{60}D_m$ illustrated in FIG. 10.

Figure 11:
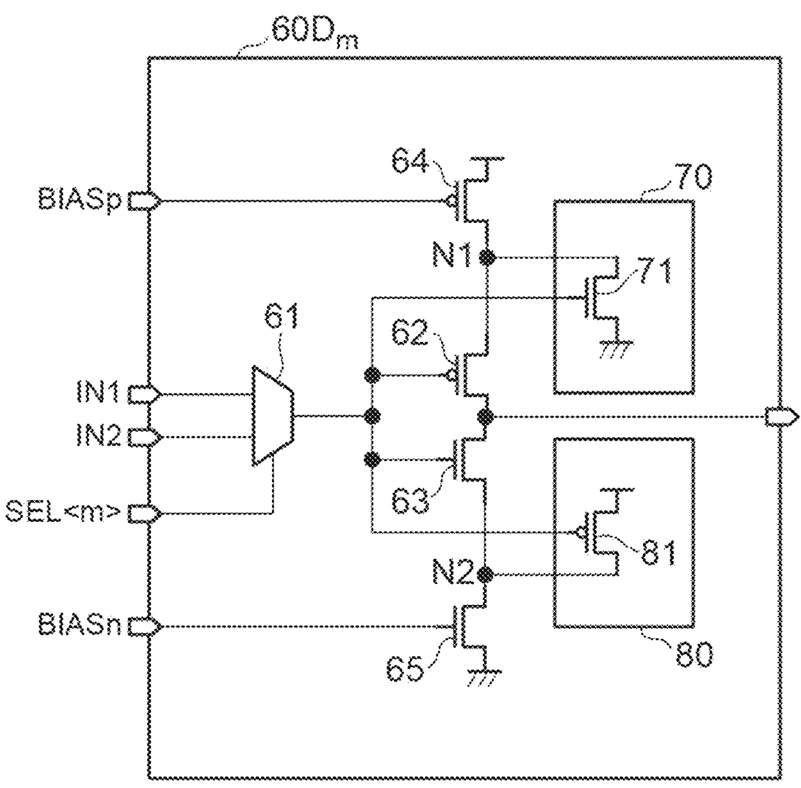
FIG. 11 is a diagram illustrating a circuit configuration example of the slice circuit 60$D_m$ of the current control unit 10.

The first standby voltage set circuit 70 and the second standby voltage set circuit 80 of the slice circuit $\mathbf{60}D_m$ of the circuit configuration example illustrated in FIG. 11 have the same configurations and functions as those of the first standby voltage set circuit 70 and the second standby voltage set circuit 80 of the slice circuit $\mathbf{60}B_m$ of the circuit configuration example illustrated in FIG. 5. However, the first standby voltage set circuit 70 and the second standby voltage set circuit 80 are different from the example in that the first standby voltage set circuit 70 and the second standby voltage set circuit 80 continue to flow current even when the first node N1 and the second node N2 are set to the standby voltage.

Figure 12:
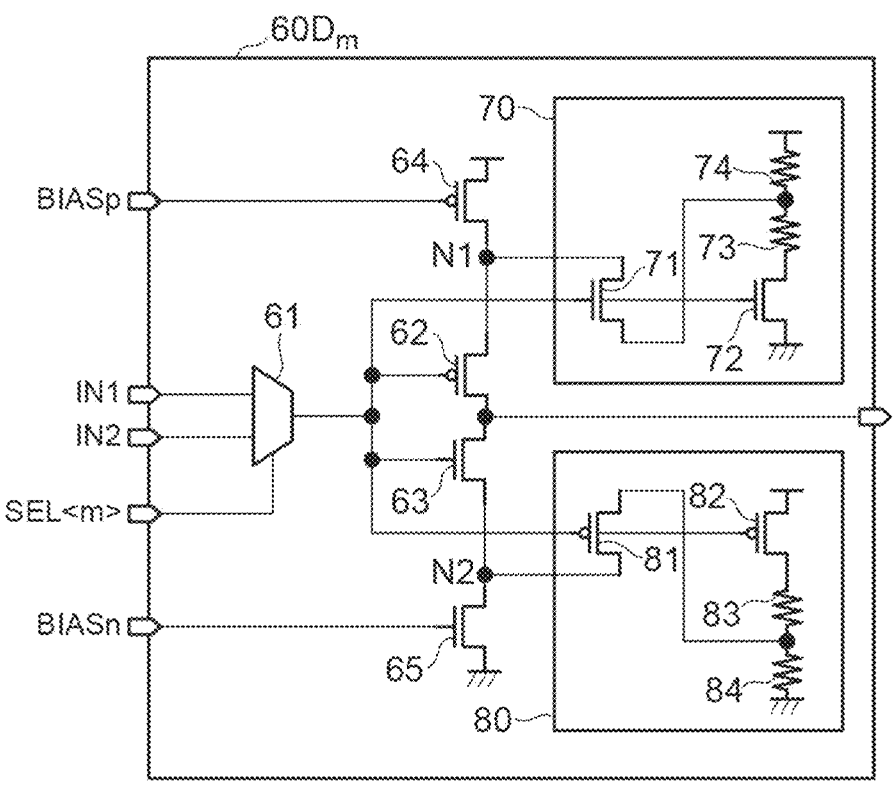
FIG. 12 is a diagram illustrating a circuit configuration example of the slice circuit 60$D_m$ of the current control unit 10.

The first standby voltage set circuit 70 and the second standby voltage set circuit 80 of the slice circuit $\mathbf{60}D_m$ of the circuit configuration example illustrated in FIG. 12 have the same configurations and functions as those of the first standby voltage set circuit 70 and the second standby voltage set circuit 80 of the slice circuit $\mathbf{60}B_m$ of the circuit configuration example illustrated in FIG. 6. However, the first standby voltage set circuit 70 and the second standby voltage set circuit 80 are different from the example in that the first standby voltage set circuit 70 and the second standby voltage set circuit 80 continue to flow current even when the first node N1 and the second node N2 are set to the standby voltage.

Figure 13:
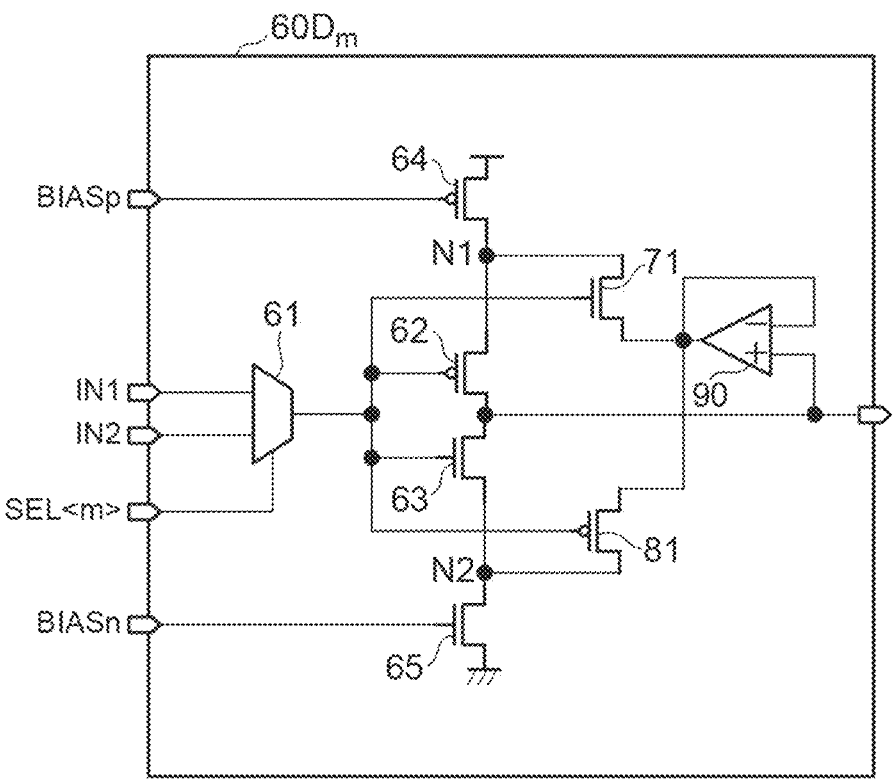
FIG. 13 is a diagram illustrating a circuit configuration example of the slice circuit 60$D_m$ of the current control unit 10.

The first standby voltage set circuit 70 and the second standby voltage set circuit 80 of the slice circuit $\mathbf{60}D_m$ of the circuit configuration example illustrated in FIG. 13 have the same configurations and functions as those of the first standby voltage set circuit 70 and the second standby voltage set circuit 80 of the slice circuit $\mathbf{60}B_m$ of the circuit configuration example illustrated in FIG. 7. However, the first standby voltage set circuit 70 and the second standby voltage set circuit 80 are different from the example in that the first standby voltage set circuit 70 and the second standby voltage set circuit 80 continue to flow current even when the first node N1 and the second node N2 are set to the standby voltage.

Figure 14:
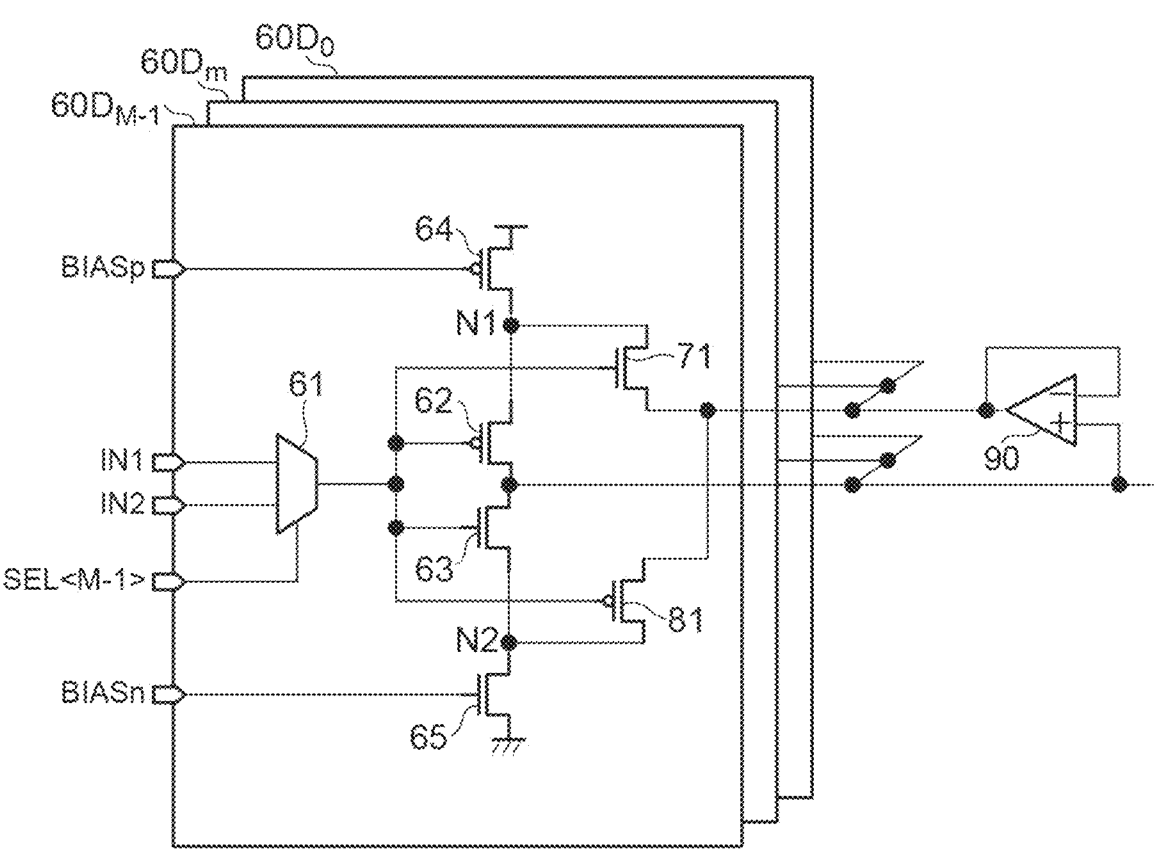
FIG. 14 is a diagram illustrating a circuit configuration example of the slice circuit 60$D_m$ of the current control unit 10.

The first standby voltage set circuit 70 and the second standby voltage set circuit 80 of the slice circuit $\mathbf{60}D_m$ of the circuit configuration example illustrated in FIG. 14 have the same configurations and functions as those of the first standby voltage set circuit 70 and the second standby voltage set circuit 80 of the slice circuit $\mathbf{60}B_m$ of the circuit configuration example illustrated in FIG. 8. However, the first standby voltage set circuit 70 and the second standby voltage set circuit 80 are different from the example in that the first standby voltage set circuit 70 and the second standby voltage set circuit 80 continue to flow current even when the first node N1 and the second node N2 are set to the standby voltage.

Figure 15:
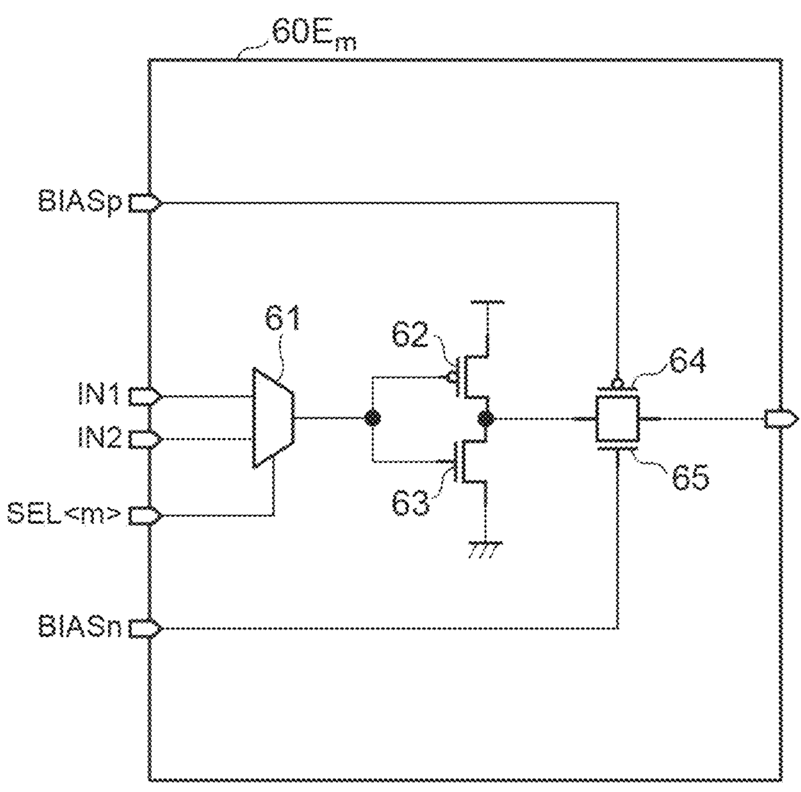
FIG. 15 is a diagram illustrating a configuration of a slice circuit 60$E_m$ of the current control unit 10.

FIG. 15 is a diagram illustrating a configuration of a slice circuit $\mathbf{60}E_m$ of the current control unit 10. The slice circuit $\mathbf{60}E_m$ illustrated in this drawing includes the selector 61, the PMOS transistor 62, the NMOS transistor 63, the PMOS transistor 64, and the NMOS transistor 65.

The source of the PMOS transistor 62 is connected to the power supply potential supply terminal. The signal output from the selector 61 is input to the gate of the PMOS transistor 62. The source of the NMOS transistor 63 is connected to the ground potential supply terminal. The signal output from the selector 61 is input to the gate of the NMOS transistor 63. The drain of the PMOS transistor 62 and the drain of the NMOS transistor 63 are connected to each other.

The bias voltage BIASp is input to the gate of the PMOS transistor 64. The bias voltage BIASn is input to the gate of the NMOS transistor 65. The PMOS transistor 64 as the first current source and the NMOS transistor 65 as the second current source are connected in parallel to each other between the drain of the PMOS transistor 62 and the NMOS transistor 63 and the output terminal.

The PMOS transistor 64 as the first current source and the NMOS transistor 65 as the second current source in the configuration of the slice circuit 60$E_m$ (FIG. 15) correspond to the PMOS transistor 64 and the NMOS transistor 65 in the configuration of the slice circuit 60$B_m$ illustrated in FIG. 5.

The configuration of the slice circuit 60$E_m$ corresponds to a configuration in which the first node N1 and the second node N2 in the configuration of the slice circuit 60$B_m$ illustrated in FIG. 5 are made common.

That is, in the slice circuit 60$E_m$, the NMOS transistor 63 serves as the NMOS transistor 71 in the configuration of the slice circuit 60$B_m$ illustrated in FIG. 5, and the PMOS transistor 62 serves as the PMOS transistor 81 in the configuration of the slice circuit 60$B_m$ illustrated in FIG. 5. Therefore, the slice circuit 60$E_m$ (FIG. 15) can perform the same operation as the slice circuit 60$B_m$ illustrated in FIG. 5 without increasing the number of MOS transistors as compared with the slice circuit 60$A_m$ illustrated in FIG. 3 and the slice circuit 60$C_m$ illustrated in FIG. 9.

Note that, in the slice circuit 60$E_m$, it is preferable to sufficiently increase the size of each of the PMOS transistor 62 and the NMOS transistor 63 so that the parasitic capacitance charge current does not affect the output of the current control unit 10.

Figure 16:
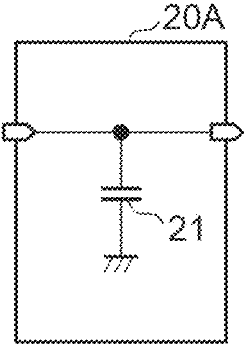
FIG. 16 is a diagram illustrating a circuit configuration example of a filter 20 of the phase interpolation circuit 1.

FIG. 16 is a diagram illustrating a circuit configuration example of the filter 20 of the phase interpolation circuit 1. A filter 20A in the configuration example illustrated in this drawing includes a capacitance unit 21. One end of the capacitance unit 21 is connected to the output terminal of the current control unit 10 and is connected to the input terminal of the waveform shaping unit 30. The other end of the capacitance unit 21 is connected to the ground potential supply terminal or the power supply potential supply terminal. The filter 20A charges or discharges the capacitance unit 21 according to the current signal output from the current control unit 10, and outputs a voltage signal corresponding to the accumulated charge amount of the capacitance unit 21 to the waveform shaping unit 30. Highly accurate phase interpolation is possible by the filter 20A satisfying that the output load of the current control unit 10 is almost constant regardless of the accumulated charge amount and that the voltage signal can be shaped by the waveform shaping unit 30.

Figure 17:
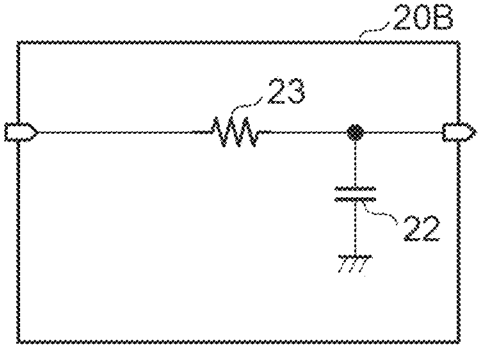
FIG. 17 is a diagram illustrating another circuit configuration example of the filter 20 of the phase interpolation circuit 1.

FIG. 17 is a diagram illustrating another circuit configuration example of the filter 20 of the phase interpolation circuit 1. A filter 20B in the configuration example illustrated in this drawing includes a capacitance unit 22 and a resistor 23. One end of the capacitance unit 22 is connected to the input terminal of the waveform shaping unit 30, and the other end of the capacitance unit 22 is connected to the ground potential supply terminal or a potential supply terminal. The resistor 23 is provided between the output terminal of the current control unit 10 and the input terminal of the waveform shaping unit 30. With the filter 20B including the resistor 23, it is possible to suppress deterioration of phase interpolation accuracy caused by frequency characteristics in an output load.

Figure 18:
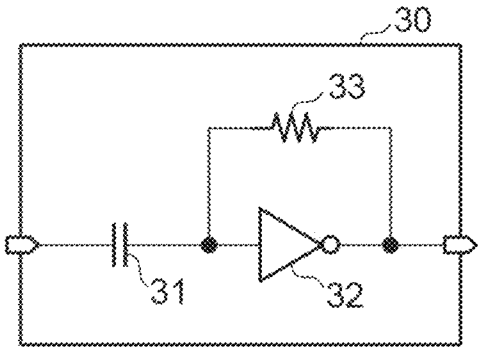
FIG. 18 is a diagram illustrating a circuit configuration example of a waveform shaping unit 30 of the phase interpolation circuit 1.

FIG. 18 is a diagram illustrating a circuit configuration example of the waveform shaping unit 30 of the phase interpolation circuit 1. The waveform shaping unit 30 illustrated in this drawing includes a coupling capacitance unit 31, an inverter 32, and a resistor 33. The input terminal of the inverter 32 is connected to the output terminal of the filter 20 via the coupling capacitance unit 31. The resistor 33 is provided between the input terminal and the output terminal of the inverter 32. The output terminal of the inverter 32 is the output terminal of the phase interpolation circuit 1. With such a configuration, the waveform shaping unit 30 can improve filter characteristics, suppress an increase in circuit scale, and shape the waveform of the output of the filter 20.

Figure 19:
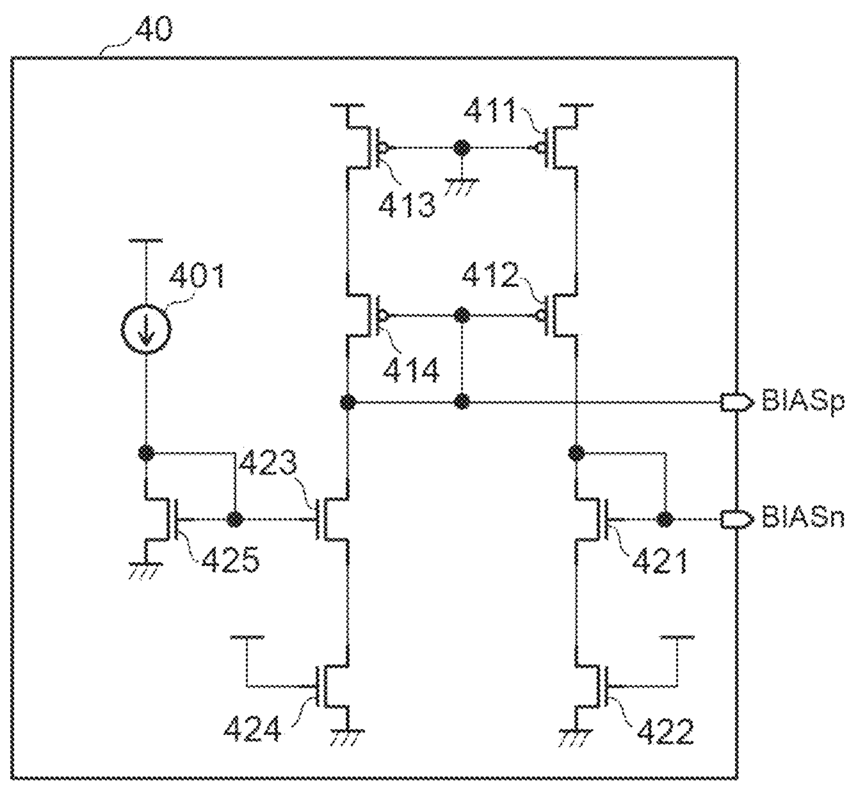
FIG. 19 is a diagram illustrating a circuit configuration example of a bias voltage supply unit 40 of the phase interpolation circuit 1.

FIG. 19 is a diagram illustrating a circuit configuration example of the bias voltage supply unit 40 of the phase interpolation circuit 1. The bias voltage supply unit 40 illustrated in this figure includes a current source 401, PMOS transistors 411 to 414, and NMOS transistors 421 to 425.

The PMOS transistor 411, the PMOS transistor 412, the NMOS transistor 421, and the NMOS transistor 422 are connected in series between the high potential (power supply potential) supply terminal and the low potential (ground potential) supply terminal in this order. The PMOS transistor 413, the PMOS transistor 414, the NMOS transistor 423, and the NMOS transistor 424 are connected in series between the high potential supply terminal and the low potential supply terminal in this order.

The gates of the PMOS transistor 411 and the PMOS transistor 413 are connected to the low potential supply terminal, and operates as a constant current source. The gates of the PMOS transistor 412 and the PMOS transistor 414 are connected to each other, connected to the drain of the PMOS transistor 414, and also connected to a BIASp output terminal.

The gate and the drain of the NMOS transistor 421 are connected to each other and also connected to a BIASn output terminal. The gate of the NMOS transistor 423 is connected to the gate and the drain of the NMOS transistor 425. The gates of the NMOS transistor 422 and the NMOS transistor 424 are connected to the high potential supply terminal, and operates as a constant current source.

The source of the NMOS transistor 425 is connected to the low potential supply terminal. The current source 401 is provided between the high potential supply terminal and the drain of the NMOS transistor 425, and can flow a certain amount of current between the drain and the source of the NMOS transistor 425.

The bias voltage supply unit 40 is suitable for supplying the bias voltage BIASp to the gate of the PMOS transistor 64 of the slice circuit 60$A_m$ (FIG. 3) or the slice circuit 60$B_m$ (FIGS. 4 to 8) and for supplying the bias voltage BIASn to the gate of the NMOS transistor 65.

The NMOS transistors 425 and 423 constitute a current mirror circuit. The PMOS transistors 412 and 414 and the PMOS transistor 64 constitute a current mirror circuit. The NMOS transistor 421 and the NMOS transistor 65 constitute a current mirror circuit.

In addition, a first circuit portion including the PMOS transistors 411 and 412 and the NMOS transistors 421 and 422 connected in series and a second circuit portion including the PMOS transistors 413 and 414 and the NMOS transistors 423 and 424 connected in series are replicas of the circuit portion including the PMOS transistors 62 and 64 and the NMOS transistors 65 and 63 connected in series of the slice circuit 60$A_m$ (FIG. 3) or the slice circuit 60$B_m$ (FIGS. 4 to 8).

Therefore, the amount of current flowing through the NMOS transistor 425, the amount of current flowing through the first circuit portion, the amount of current flowing through the second circuit portion, the amount of current flowing through the PMOS transistor 64, and the amount of current flowing through the NMOS transistor 65 are the same. By using the bias voltage supply unit 40 having such a circuit configuration, in the slice circuit 60$A_m$ (FIG. 3) or the slice circuit 60$B_m$ (FIGS. 4 to 8), the amount of current flowing through each of the PMOS transistor 64 and the NMOS transistor 65 can be set to the amount of current of the current source 401 of the bias voltage supply unit 40 with high accuracy, can be made equal to each other, and highly accurate phase interpolation is possible.

In the scalable INV-type phase interpolation circuit, the accuracy of the amount of current flowing through each of the PMOS transistor 64 as the first current source and the NMOS transistor 65 as the second current source of the slice circuits 60$A_m$ and 60$B_m$ of the current control unit 10 affects the accuracy of phase interpolation. Therefore, even if the characteristics of the MOS transistor have manufacturing variations, the amount of current flowing through each of the PMOS transistor 64 and the NMOS transistor 65 is required to be accurate. In the bias voltage supply unit 40 having the above configuration, since the characteristics of each MOS transistor similarly change even if there is manufacturing variation, it is possible to cause an intended current to flow in the MOS transistor used as the current source.

Figure 20:
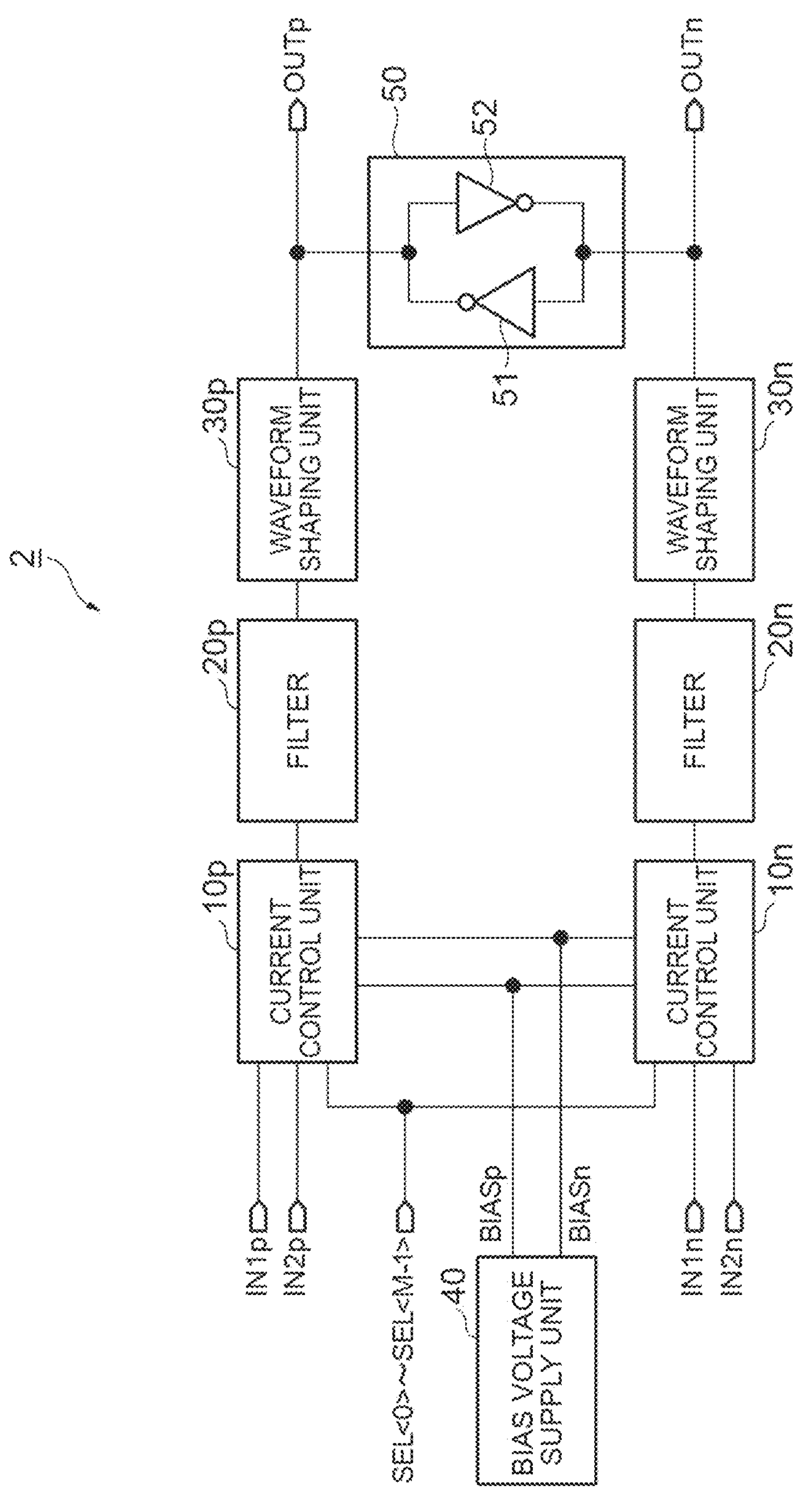
FIG. 20 is a diagram illustrating a configuration of a phase interpolation circuit 2.

FIG. 20 is a diagram illustrating a configuration of a phase interpolation circuit 2. The phase interpolation circuit 2 illustrated in this drawing is used in a case where the input signal and the output signal are differential signals. The phase interpolation circuit 2 includes a current control unit 10*p*, a current control unit 10*n*, a filter 20*p*, a filter 20*n*, a waveform shaping unit 30*p*, a waveform shaping unit 30*n*, the bias voltage supply unit 40, and a cross-coupling inverter 50.

The current control unit 10*p* and the current control unit 10*n* of the phase interpolation circuit 2 have the same configuration as the current control unit 10 of the phase interpolation circuit 1. The filter 20*p* and the filter 20*n* of the phase interpolation circuit 2 have the same configuration as the filter 20 of the phase interpolation circuit 1. The waveform shaping unit 30*p* and the waveform shaping unit 30*n* of the phase interpolation circuit 2 have the same configuration as the waveform shaping unit 30 of the phase interpolation circuit 1. The bias voltage supply unit 40 of the phase interpolation circuit 2 has the same configuration as the bias voltage supply unit 40 of the phase interpolation circuit 1.

The cross-coupling inverter 50 is provided between an OUTp output terminal of the waveform shaping unit 30*p* and an OUTn output terminal of the waveform shaping unit 30*n*. The cross-coupling inverter 50 includes an inverter 51 and an inverter 52. The input terminal of the inverter 51 is connected to the OUTn output terminal of the waveform shaping unit 30*n*, and the output terminal of the inverter 51 is connected to the OUTp output terminal of the waveform shaping unit 30*p*. The input terminal of the inverter 52 is connected to the OUTp output terminal of the waveform shaping unit 30*p*, and the output terminal of the inverter 52 is connected to the OUTn output terminal of the waveform shaping unit 30*n*.

One signal IN1*p* of the input signals IN1 (IN1*p*, IN1*n*), which is a differential signal, is input to the current control unit 10*p*, and the other signal IN1*n* is input to the current control unit 10*n*. One signal IN2*p* of the input signals IN2 (IN2*p*, IN2*n*), which is a differential signal, is input to the current control unit 10*p*, and the other signal IN2*n* is input to the current control unit 10*n*. The selection signals SEL<0> to SEL<M-1> are commonly input to both the current control unit 10*p* and the current control unit 10*n*. The bias voltages BIASp and BIASn output from the bias voltage supply unit 40 are commonly input to both the current control unit 10*p* and the current control unit 10*n*.

The current control unit 10*p*, the filter 20*p*, and the waveform shaping unit 30*p* output, from the OUTp output terminal, signals obtained by performing phase interpolation on the basis of the input signals IN1*p* and IN2*p* and the selection signals SEL<0> to SEL<M-1>. The current control unit 10*n*, the filter 20*n*, and the waveform shaping unit 30*n* output, from the OUTn output terminal, signals obtained by performing phase interpolation on the basis of the input signals IN1*n* and IN2*n* and the selection signals SEL<0> to SEL<M-1>. In the differential signals obtained by performing phase interpolation and output from the OUTp output terminal and the OUTn output terminal, edge matching as differential signals is ensured by the cross-coupling inverter 50.

Next, by using the phase interpolation circuit 1 including the slice circuit 60$A_m$ illustrated in FIG. 3 as a comparative example and using the phase interpolation circuit 1 including the slice circuit 60$B_m$ illustrated in FIG. 5 as an example, a result of comparing the linearity of the phase interpolation of both circuits by circuit simulation will be described. In both the comparative example and the example, the number of the slice circuits included in the current control unit is set to eight, two input signals IN1 and IN2 having phases different from each other by 90° are input to the current control unit, and the frequency of the input signal is set to 8 GHz or 32 GHz.

Figure 21:
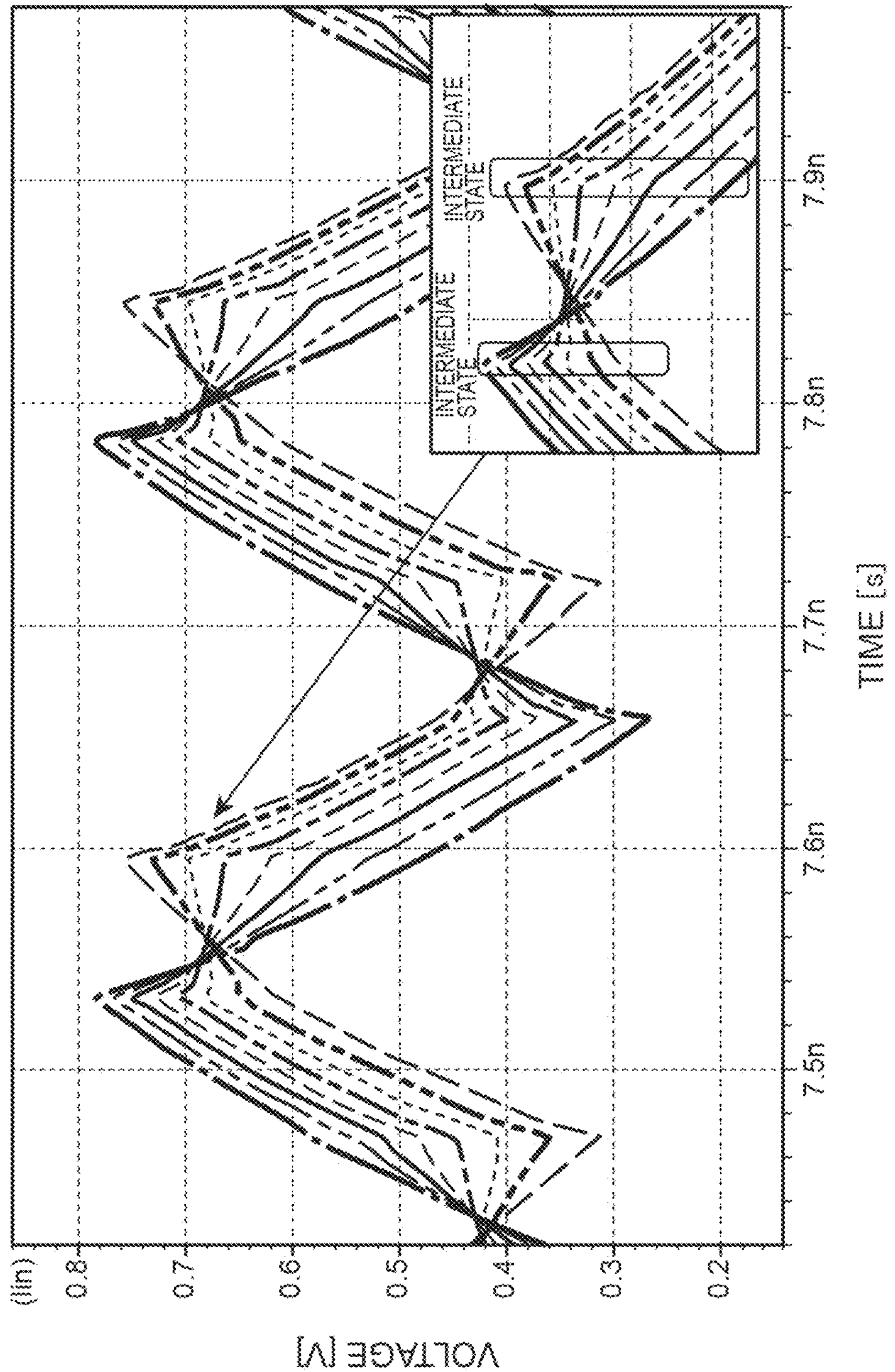
FIG. 21 is a diagram illustrating a temporal change of a voltage signal output from a filter when an input signal of 8 GHz is input to a phase interpolation circuit in a comparative example.
Figure 22:
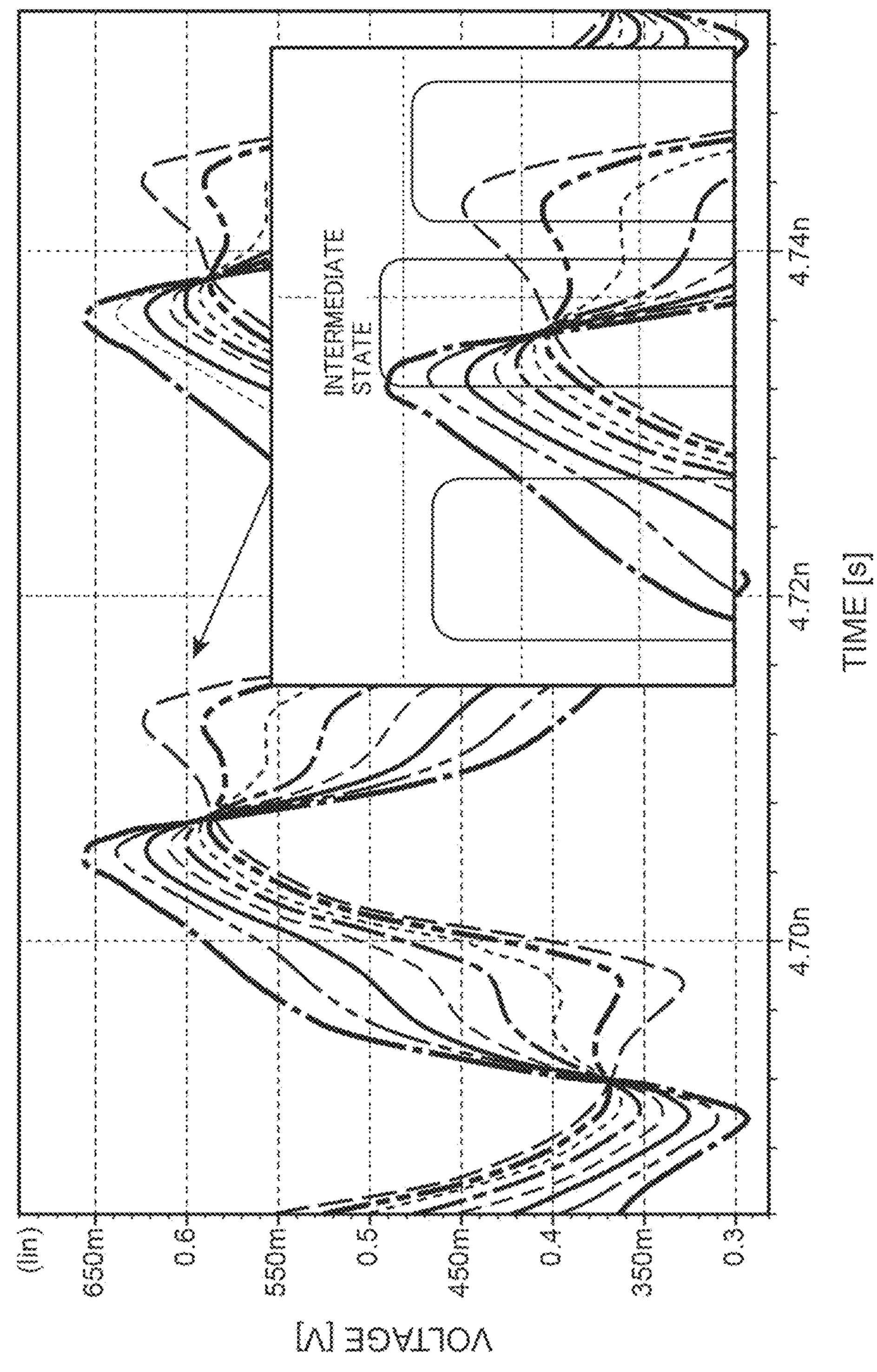
FIG. 22 is a diagram illustrating a temporal change of a voltage signal output from a filter when an input signal of 32 GHz is input to the phase interpolation circuit in the comparative example.
Figure 23:
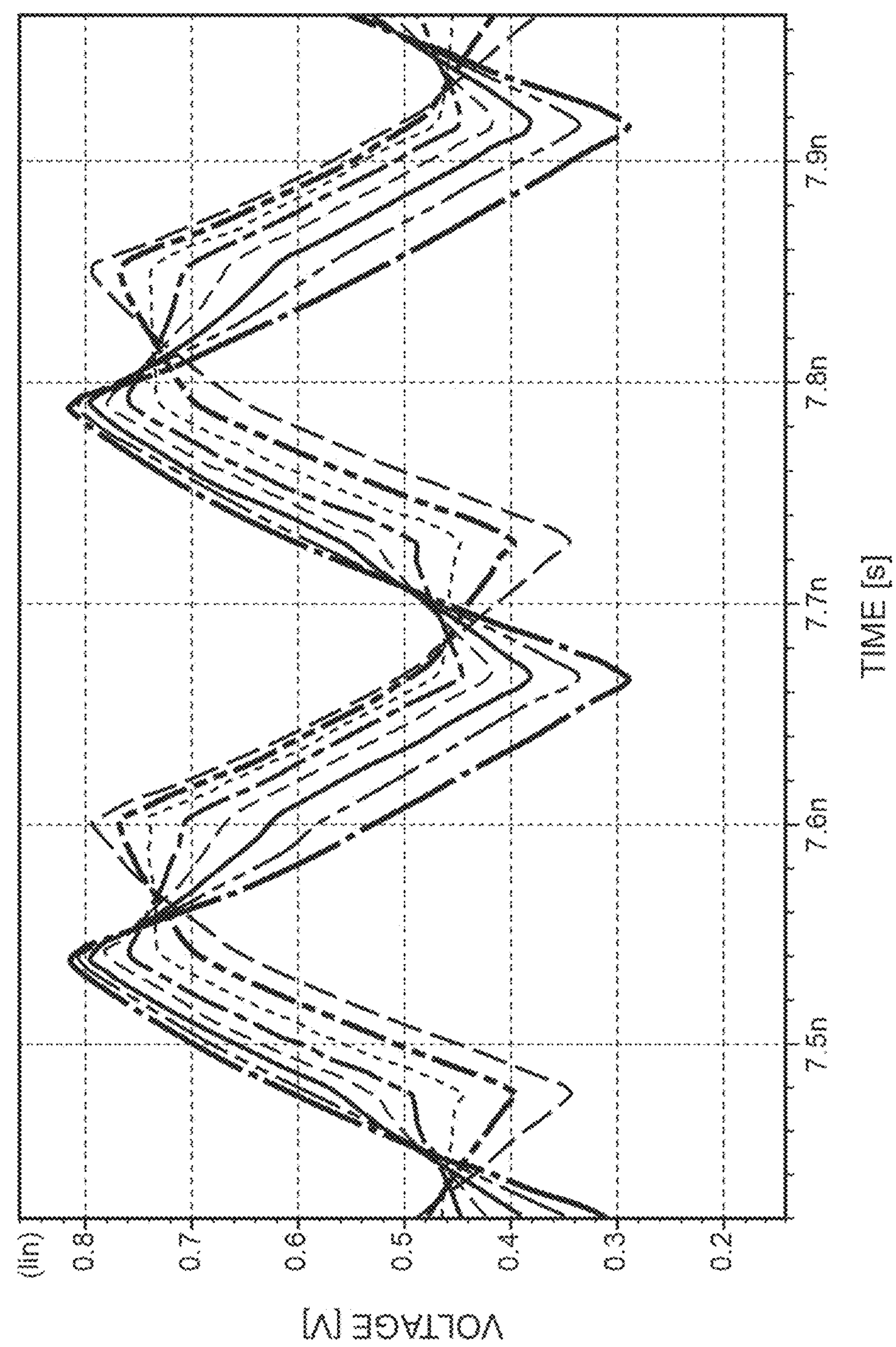
FIG. 23 is a diagram illustrating a temporal change of a voltage signal output from a filter when an input signal of 8 GHz is input to a phase interpolation circuit in an example.
Figure 24:
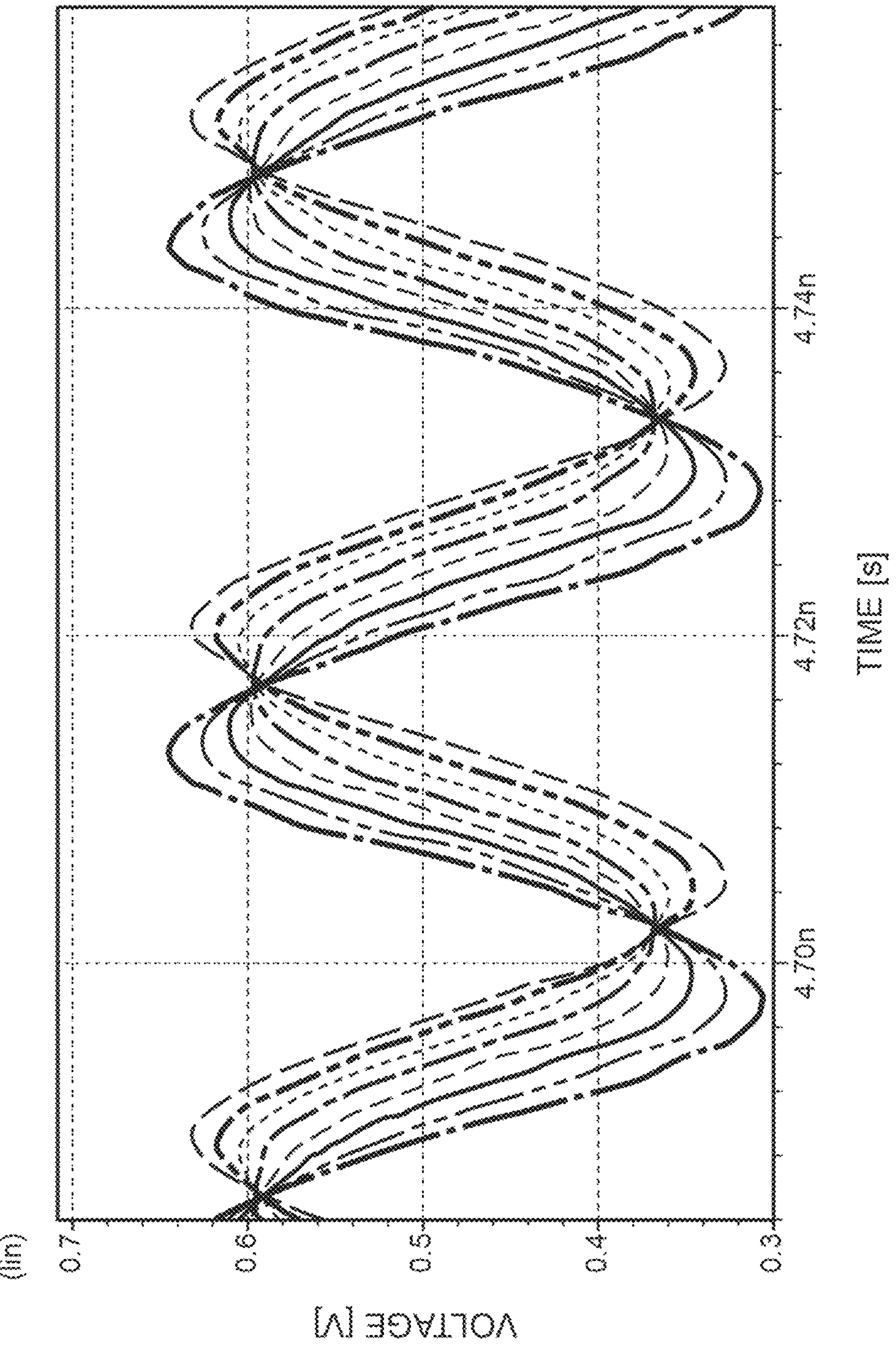
FIG. 24 is a diagram illustrating a temporal change of a voltage signal output from a filter when an input signal of 32 GHz is input to the phase interpolation circuit in the example.

FIG. 21 is a diagram illustrating a temporal change of a voltage signal output from the filter when an input signal of 8 GHz is input to the phase interpolation circuit in the comparative example. FIG. 22 is a diagram illustrating a temporal change of a voltage signal output from the filter when an input signal of 32 GHz is input to the phase interpolation circuit in the comparative example. FIG. 23 is a diagram illustrating a temporal change of a voltage signal output from the filter when an input signal of 8 GHz is input to the phase interpolation circuit in the example. FIG. 24 is a diagram illustrating a temporal change of a voltage signal output from a filter when an input signal of 32 GHz is input to the phase interpolation circuit in the example. These drawings illustrate temporal changes of the voltage signal for each value of the PI code corresponding to the eight selection signals SEL<0> to <7>.

As illustrated in these drawings, in the comparative example, the period of the intermediate state is long. In addition, as the speed of the input signal is higher, the period of the intermediate state becomes longer with respect to the period in which the current of the slice circuit $A_m$ is the current I1 or the current I2. As the period of the intermediate state is longer with respect to the period in which the current of the slice circuit $A_m$ is the current I1 or the current I2, deterioration of the linearity of the phase interpolation becomes larger. Therefore, in the comparative example, the linearity of the phase interpolation is deteriorated, and the phase of the output signal from the phase interpolation circuit is different from the intended phase to be set by the selection signal. On the other hand, in the example, the period of the intermediate state is short as compared with the comparative example, and the deterioration of the linearity of the phase interpolation is small.

Figure 25:
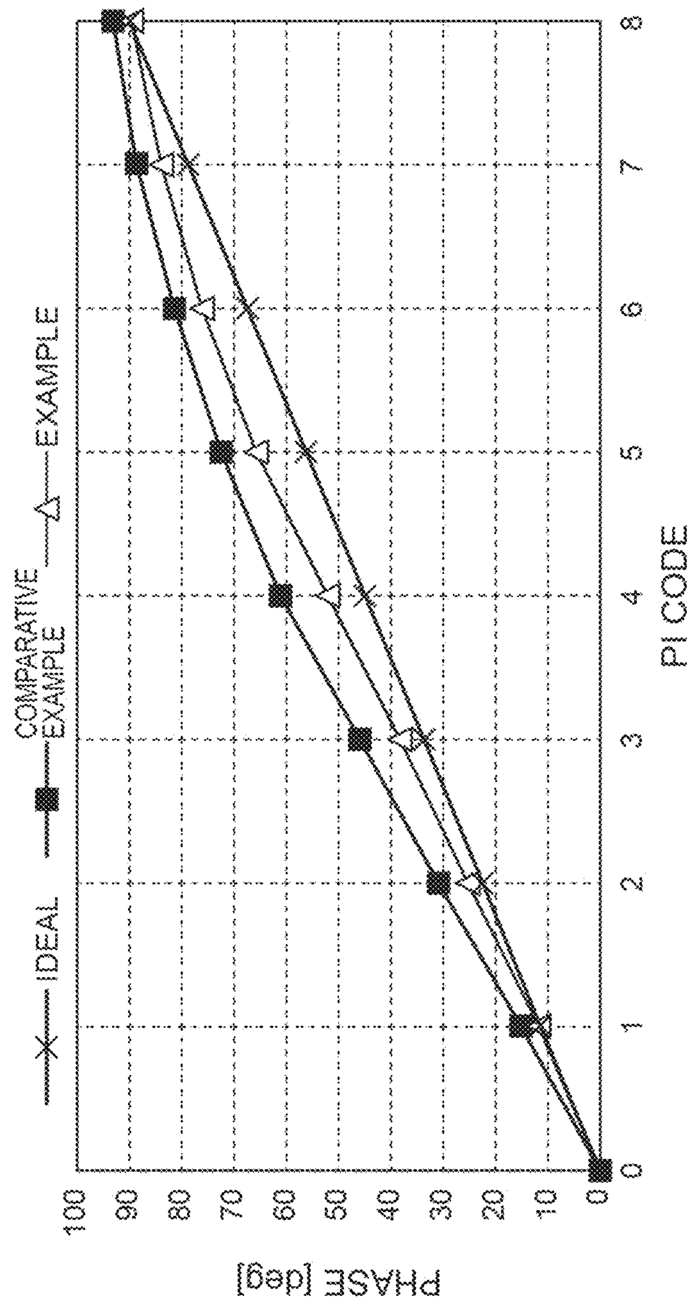
FIG. 25 is a graph illustrating a relationship between a PI code and an output phase for each of the comparative example and the example.

FIG. 25 is a graph illustrating a relationship between the PI code and the output phase of the phase interpolation circuit when an input signal of 32 GHz is input to the phase interpolation circuit for each of the comparative example and the example. The output phases are relative phases obtained by taking a difference from the phase of the PI code 0. In this drawing, a graph in a case where the output phase has ideal linearity with respect to the PI code is also illustrated. As illustrated in this drawing, the linearity of the phase interpolation is improved in the example as compared with the comparative example.

In a clock data recovery circuit, an interleaved analog-digital conversion circuit, or the like, in a case where data sampling is performed using a clock the phase of which is interpolated by a phase interpolation circuit and that is output, superiority or inferiority of the linearity of the output phase of the phase interpolation circuit affects a result of the data sampling. Hereinafter, this will be described, and a simulation result will also be described.

In general, even in a signal that transitions between binary values of an H level and an L level before transmission, a waveform of the signal transmitted by a signal line is deteriorated. An eye diagram is used as an index for evaluating the quality (degree of waveform deterioration) of a signal waveform. The eye diagram is a diagram in which signals are superimposed and displayed with two minimum units of transmission data as one cycle. The larger the height and width of the opening (eye opening) of the eye diagram is, the better the quality of communication is.

Communication devices are required to pass various tests and satisfy required standards, and it is also required to pass an eye diagram mask test as one of the tests. In the eye diagram mask test, the acceptance condition is that the eye opening is larger than a specific mask pattern. In a communication device that does not satisfy the acceptance condition, an environment in which communication can be established is limited, and thus the value as a device is reduced.

In the simulation, an eye diagram of a pseudorandom signal is obtained by performing data sampling on a pseudorandom signal (a PRBS7 signal) transmitted through the signal line using a clock the phase of which is interpolated by the phase interpolation circuit in each of the comparative example and the example and that is output, the phase interpolation circuit having the relationship between the PI code and the output phase illustrated in FIG. 25.

Figure 26:
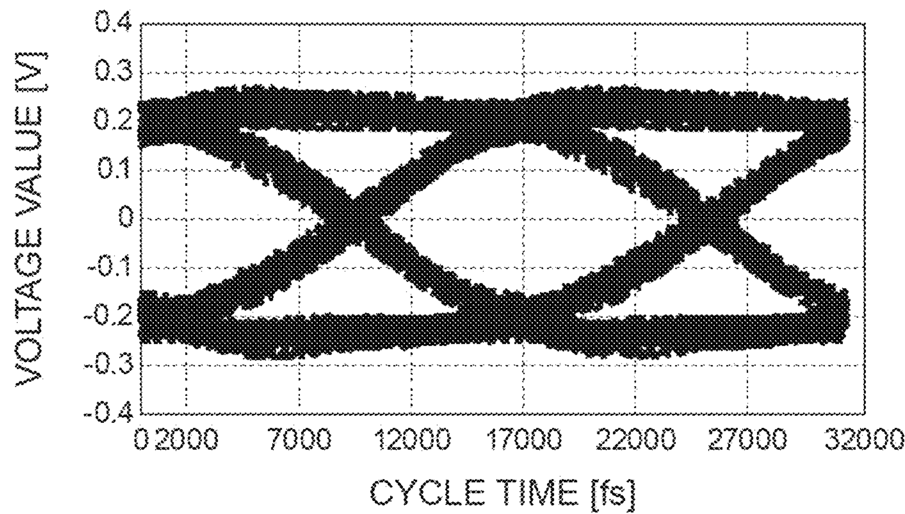
FIG. 26 is a view illustrating an eye diagram obtained when a clock the phase of which is interpolated by a phase interpolation circuit and that is output is used, the output phase of the phase interpolation circuit having ideal linearity with respect to a PI code.
Figure 27:
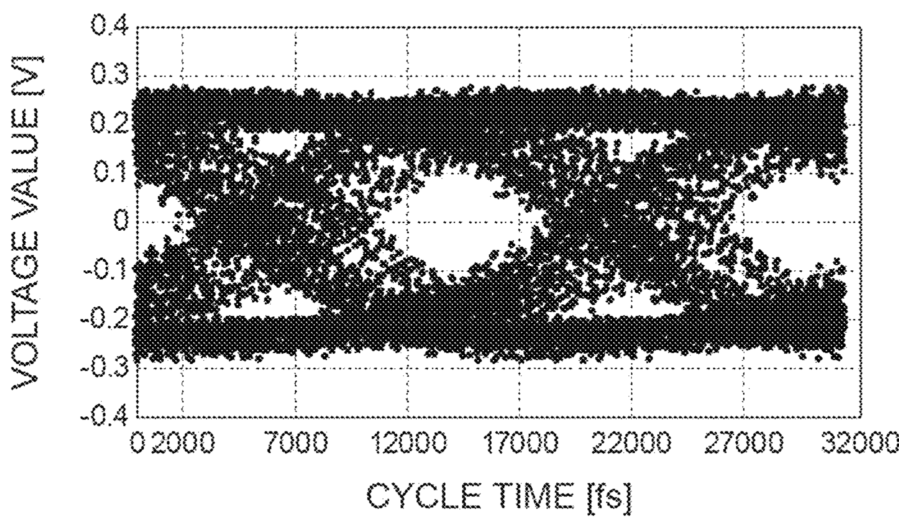
FIG. 27 is a view illustrating an eye diagram obtained when a clock the phase of which is interpolated by the phase interpolation circuit in the comparative example and that is output is used.
Figure 28:
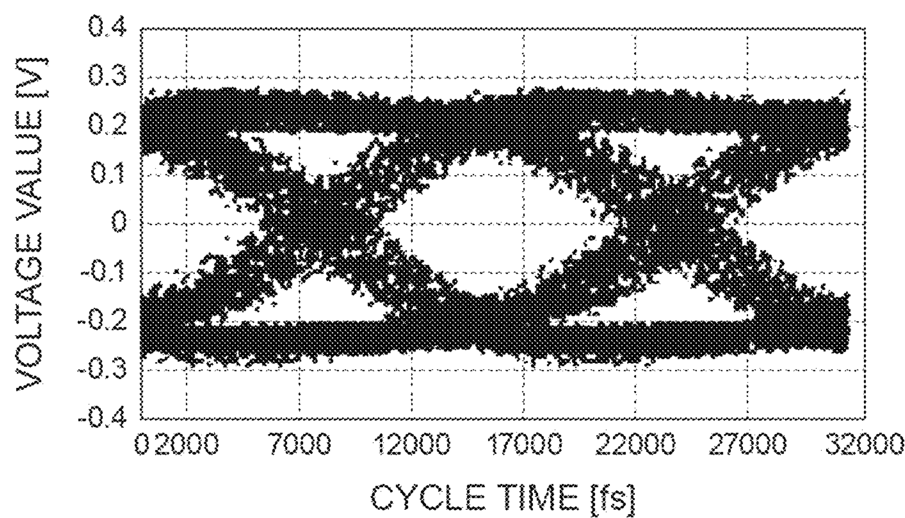
FIG. 28 is a view illustrating an eye diagram obtained when a clock the phase of which is interpolated by the phase interpolation circuit in the example and that is output is used.

FIG. 26 is a view illustrating an eye diagram obtained when a clock the phase of which is interpolated by a phase interpolation circuit and that is output is used, the output phase of the phase interpolation circuit having ideal linearity with respect to the PI code. FIG. 27 is a view illustrating an eye diagram obtained when a clock the phase of which is interpolated by a phase interpolation circuit in the comparative example and that is output is used. FIG. 28 is a view illustrating an eye diagram obtained when a clock the phase of which is interpolated by a phase interpolation circuit in the example and that is output is used. It is assumed that the data rate of the input signal is 64 GBps, the sampling clock is an 8-phase clock of 30.29 GHz, and the 8-phase clock is generated by the phase interpolation circuits in the comparative example and the example.

As illustrated in these drawings, the eye opening in the comparative example is smaller than in the ideal case. Therefore, the performance of a reception device that performs data sampling using the phase interpolation circuit in the comparative example is poor, and it is difficult for the reception device to satisfy a required standard, so that the value as a device is low. On the other hand, in the example, since phase error is improved as compared with the comparative example, the eye opening is large, and the degree of reduction of the eye opening is small as compared with the ideal case. The phase interpolation circuit in the example can satisfy the acceptance condition of the eye diagram mask test as compared with the comparative example even when the input signal is high speed.

REFERENCE SIGNS LIST

1, 2 . . . Phase interpolation circuit, 10, 10*p*, 10*n* . . . Current control unit, 20, 20A, 20B, 20*p*, 20*n* . . . Filter, 30, 30*p*, 30*n* . . . Waveform shaping unit, 40 . . . Bias voltage supply unit, 50 . . . Cross-coupling inverter, $60_0$ to $60_{M-1}$, $60_m$, $60A_m$, $60B_m$, $60C_m$, $60D_m$, $60E_m$ . . . Slice circuit, 61 . . . Selector, 62 . . . PMOS transistor, 63 . . . NMOS transistor, 64 . . . PMOS transistor, 65 . . . NMOS transistor, 70 . . . First standby voltage set circuit, 71, 72 . . . NMOS transistor, 73, 74 . . . Resistor, 80 . . . Second standby voltage set circuit, 81, 82 . . . PMOS transistor, 83, 84 . . . Resistor, 90 . . . Amplifier.

The invention claimed is:

1. A phase interpolation circuit, comprising:

a scalable INV-type phase interpolation circuit configured to include a current control unit including a plurality of slice circuits, the plurality of slice circuits outputting, from an output terminal, a current signal corresponding to any signal selected from a plurality of input signals having phases different from each other, and output a signal a phase of which is interpolated on a basis of the plurality of input signals, wherein each of the slice circuits includes:

a selector configured to select and output any signal of the plurality of input signals on a basis of a selection signal;

a first PMOS transistor having a gate to which the signal output from the selector is input, a source connected to a high potential supply terminal, and a drain;

an first NMOS transistor having a gate to which the signal output from the selector is input, a source connected to a low potential supply terminal, and a drain;

a first current source provided between the drain of the first PMOS transistor and the output terminal;

a second current source provided between the drain of the first NMOS transistor and the output terminal;

a first standby voltage set circuit configured to set a first node between the drain of the first PMOS transistor and the first current source to a standby voltage by charging and discharging a parasitic capacitance at the first node, wherein the first standby voltage set circuit has a first switch that receives the signal output from the selector to connect a first potential to the first node; and a second standby voltage set circuit configured to set a second node between the drain of the first NMOS transistor and the second current source to a standby voltage by charging and discharging a parasitic capacitance at the second node, wherein the second standby voltage set circuit has a second switch that receives the signal output from the selector to connect a second potential to the second node.

2. The phase interpolation circuit according to claim 1, wherein the first standby voltage set circuit includes a second NMOS transistor provided between the low potential supply terminal and the first node, the second NMOS transistor having a gate to which the signal output from the selector is input, and the second standby voltage set circuit includes a second PMOS transistor provided between the high potential supply terminal and the second node, the second PMOS transistor having a gate to which the signal output from the selector is input.

3. The phase interpolation circuit according to claim 1, wherein the first standby voltage set circuit includes:

a first resistor and a second resistor provided in series between the high potential supply terminal and the low potential supply terminal;

a second NMOS transistor provided between a connection point between the first resistor and the second resistor and the first node; and a third NMOS transistor provided in series with respect to the first resistor and the second resistor, the signal output from the selector being input to gates of the second NMOS transistor and the third NMOS transistor, and wherein the second standby voltage set circuit includes:

a third resistor and a fourth resistor provided in series between the high potential supply terminal and the low potential supply terminal;

a second PMOS transistor provided between a connection point between the third resistor and the fourth resistor and the second node; and a third PMOS transistor provided in series with the third resistor and the fourth resistor, the signal output from the selector being input to gates of the second PMOS transistor and the third PMOS transistor.

4. The phase interpolation circuit according to claim 1, further comprising:

a filter configured to include a capacitance unit charged and discharged according to a sum of current signals output from the plurality of slice circuits of the current control unit and to output a voltage signal according to an accumulated charge amount in the capacitance unit; and a waveform shaping unit configured to shape a waveform of the voltage signal output from the filter and output the waveform-shaped signal.

5. A phase interpolation circuit, comprising:

a scalable INV-type phase interpolation circuit configured to include a current control unit including a plurality of slice circuits, the plurality of slice circuits outputting, from an output terminal, a current signal corresponding to any signal selected from a plurality of input signals having phases different from each other, and output a signal a phase of which is interpolated on a basis of the plurality of input signals, wherein each of the slice circuits includes:

a selector configured to select and output any signal of the plurality of input signals on a basis of a selection signal;

a PMOS transistor having a gate to which the signal output from the selector is input, a drain connected to the output terminal, and a source;

an NMOS transistor having a gate to which the signal output from the selector is input, a drain connected to the output terminal, and a source;

a first current source provided between the source of the PMOS transistor and a high potential supply terminal;

a second current source provided between the source of the NMOS transistor and a low potential supply terminal;

a first standby voltage set circuit configured to set a first node between the source of the PMOS transistor and the first current source to a standby voltage by charging and discharging a parasitic capacitance at the first node, wherein the first standby voltage set circuit has a first switch that receives the signal output from the selector to connect a first potential to the first node; and a second standby voltage set circuit configured to set a second node between the source of the NMOS transistor and the second current source to a standby voltage by charging and discharging a parasitic capacitance at the second node, wherein the second standby voltage set circuit has a second switch that receives the signal output from the selector to connect a second potential to the second node.

6. A phase interpolation circuit, comprising:

a scalable INV-type phase interpolation circuit configured to include a current control unit including a plurality of slice circuits, the plurality of slice circuits outputting, from an output terminal, a current signal corresponding to any signal selected from a plurality of input signals having phases different from each other, and output a signal a phase of which is interpolated on a basis of the plurality of input signals, wherein each of the slice circuits includes:

a selector configured to select and output any signal of the plurality of input signals on a basis of a selection signal;

a PMOS transistor having a gate to which the signal output from the selector is input, a source connected to a high potential supply terminal, and a drain;

an NMOS transistor having a gate to which the signal output from the selector is input, a source connected to a low potential supply terminal, and a drain;

a first current source provided between the drain of the PMOS transistor and the output terminal;

a second current source provided between the drain of the NMOS transistor and the output terminal;

a first standby voltage set circuit configured to set a first node between the drain of the PMOS transistor and the first current source to a standby voltage by charging and discharging a parasitic capacitance at the first node; and a second standby voltage set circuit configured to set a second node between the drain of the NMOS transistor and the second current source to a standby voltage by charging and discharging a parasitic capacitance at the second node, wherein the first standby voltage set circuit includes:

a first voltage follower amplifier configured to receive a potential of the output terminal of the slice circuit; and an NMOS transistor provided between an output terminal of the first voltage follower amplifier and the first node, the NMOS transistor having a gate to which the signal output from the selector is input, and wherein the second standby voltage set circuit includes:

a second voltage follower amplifier configured to receive a potential of the output terminal of the slice circuit; and a PMOS transistor provided between an output terminal of the second voltage follower amplifier and the second node, the PMOS transistor having a gate to which the signal output from the selector is input.

7. The phase interpolation circuit according to claim 6, wherein each of the slice circuits includes a common voltage follower amplifier as the first voltage follower amplifier and the second voltage follower amplifier.

8. The phase interpolation circuit according to claim 6, wherein the current control unit includes:

a first common voltage follower amplifier as the first voltage follower amplifier of each of the slice circuits, a second common voltage follower amplifier as the second voltage follower amplifier of each of the slice circuits.

9. The phase interpolation circuit according to claim 6, wherein the current control unit includes:

a common voltage follower amplifier as the first voltage follower amplifier and the second voltage follower amplifier of each of the slice circuits.

10. A phase interpolation circuit, comprising:

a scalable INV-type phase interpolation circuit configured to include a current control unit including a plurality of slice circuits, the plurality of slice circuits outputting, from an output terminal, a current signal corresponding to any signal selected from a plurality of input signals having phases different from each other, and output a signal obtained by interpolating a phase on a basis of the plurality of input signals, wherein each of the slice circuits includes:

a selector configured to select and output any signal of the plurality of input signals on a basis of a selection signal;

a PMOS transistor having a gate to which the signal output from the selector is input, a source connected to a high potential supply terminal, and a drain;

an NMOS transistor having a gate to which the signal output from the selector is input, a source connected to a low potential supply terminal, and a drain;

a first current source provided between the drain of the PMOS transistor and the output terminal; and a second current source provided between the drain of the NMOS transistor and the output terminal, the drain of the PMOS transistor and the drain of the NMOS transistor being directly connected to each other.

* * * * *